US011107544B2

(12) United States Patent
Jung

(10) Patent No.: US 11,107,544 B2
(45) Date of Patent: Aug. 31, 2021

(54) SEMICONDUCTOR MEMORY DEVICE INCLUDING NON-VOLATILE STORAGE CIRCUIT AND OPERATING METHOD THEREOF

(71) Applicant: SK hynix Inc., Gyeonggi-do (KR)

(72) Inventor: Chul-Moon Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/930,507

(22) Filed: May 13, 2020

(65) Prior Publication Data

US 2021/0193241 A1 Jun. 24, 2021

(30) Foreign Application Priority Data

Dec. 23, 2019 (KR) ........................ 10-2019-0173037

(51) Int. Cl.
*G11C 17/00* (2006.01)
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ......... G11C 17/18; G11C 17/16; G11C 29/78; G11C 29/785; G11C 29/787
See application file for complete search history.

(56) References Cited

U.S. PATENT DOCUMENTS

| 6,603,689 B2* | 8/2003 | Kato ..................... G11C 29/787 365/200 |
| 9,852,814 B1* | 12/2017 | Kim ....................... G11C 17/18 |
| 10,020,074 B1* | 7/2018 | Jeong .................... H01L 29/513 |
| 2018/0197621 A1* | 7/2018 | Jeong ................... G11C 29/027 |
| 2018/0261301 A1* | 9/2018 | Kim ....................... G11C 29/20 |

FOREIGN PATENT DOCUMENTS

| KR | 10-2015-0072043 | 6/2015 |
| KR | 10-2017-0036884 | 4/2017 |

* cited by examiner

*Primary Examiner* — Toan K Le
(74) *Attorney, Agent, or Firm* — IP & T Group LLP

(57) ABSTRACT

A non-volatile storage device includes a non-volatile storage circuit including a plurality of fuse sets suitable for sequentially outputting fuse data according to a counting address, each fuse set including an enable fuse, a plurality of address fuses, and a duplication fuse; a read control circuit suitable for receiving the fuse data, and outputting latch data by selectively masking data of the enable fuse and the address fuses using data of the duplication fuse within the received fuse data; and a program control circuit suitable for controlling programming the duplication fuse of a duplicated fuse set among the fuse sets when a repair address inputted from outside is identical to data of the address fuses within the duplicated fuse set, or to program the repair address into an available fuse set among the fuse sets, according to a program mode signal.

20 Claims, 21 Drawing Sheets

SEMICONDUCTOR MEMORY DEVICE INCLUDING NON-VOLATILE STORAGE CIRCUIT AND OPERATING METHOD THEREOF

CROSS-REFERENCE TO RELATED APPLICATIONS

The present application claims priority to Korean Patent Application No. 10-2019-0173037, filed on Dec. 23, 2019, which is incorporated herein by reference in its entirety.

BACKGROUND

1. Field

Various embodiments of the present invention relate to semiconductor design technology, and more particularly, to a semiconductor device that transfers data from a non-volatile storage circuit to latch circuits, and an operating method thereof.

2. Description of the Related Art

A semiconductor device uses a non-volatile memory to store information for diverse internal control operations such as setup information and repair information. A fuse is widely used as the non-volatile memory. A fuse is cut by a laser to store data. A fuse may be programmed in a wafer state. Once the wafer is mounted inside a package, it is impossible to program the fuse. An e-fuse is suggested to be programmed even after the packaging phase. An e-fuse stores a data by changing a resistance between a gate and a drain/source of a transistor.

Recently, an array e-fuse (ARE) is suggested to overcome the area limitation of an e-fuse. When e-fuses are realized in the form of an array, the e-fuses may share an amplifier for amplifying the data thereof thereby reducing a total area occupied for the e-fuses. The array e-fuse is required to perform a boot-up operation for storing fuse data thereof into a latch circuit. Generally, the number of e-fuses of an array e-fuse corresponds to the number of unit latches included in the latch circuit, respectively. During the boot-up operation, the e-fuses of the array e-fuse transfer the fuse data to the latch circuit. After the boot-up operation is finished, the semiconductor device may set up the internal circuits based on the data stored in the latch circuit and perform a normal operation.

In case of a semiconductor memory device that performs a repair operation, an address of a word line or bit line to be repaired (hereinafter, referred to as a "repair address") may be stored in the array e-fuse. The semiconductor memory device may control to select a redundant word line or redundant bit line instead of a defected word line or defected bit line when an external input address matches the repair address during a normal operation. On the other hand, the same repair address may be detected at several test stages, such as wafer-level test operations or package-level operations, so that the duplicated repair addresses may be stored in the array e-fuse. During a boot-up operation, the duplicated repair addresses may be transferred to a latch circuit. After the boot-up operation is finished, the semiconductor device may perform an abnormal repair operation due to the duplicated repair addresses in the latch circuit.

SUMMARY

Embodiments of the present invention are directed to a semiconductor memory device capable of programming repair data to a non-volatile storage circuit, together with duplication repair information indicating whether the repair data are duplicated, and storing the repair data into a latch circuit according to the duplication repair information, such that the duplicated repair data may not be stored in the latch circuit.

In accordance with an embodiment of the present invention, a non-volatile storage device includes a non-volatile storage circuit including a plurality of fuse sets suitable for sequentially outputting fuse data according to a counting address, each fuse set including an enable fuse, a plurality of address fuses, and a duplication fuse; a read control circuit suitable for receiving the fuse data, and outputting latch data by selectively masking data of the enable fuse and the address fuses using data of the duplication fuse within the received fuse data; and a program control circuit suitable for controlling programming the duplication fuse of a duplicated fuse set among the fuse sets when a repair address inputted from outside is identical to data of the address fuses within the duplicated fuse set, or to program the repair address into an available fuse set among the fuse sets, according to a program mode signal.

In accordance with an embodiment of the present invention, a non-volatile storage device includes a non-volatile storage circuit including a plurality of fuse sets suitable for sequentially outputting fuse data according to a counting address, each fuse set including an enable fuse, a plurality of address fuses, and a duplication fuse; a duplication analysis circuit suitable for storing the counting address corresponding to a duplicated fuse set as a duplication address and activating a duplication enable signal when a repair address inputted from outside is identical to data of the address fuses within the duplicated fuse set; an availability analysis circuit suitable for searching an available fuse set according to data of the enable fuse, storing the counting address corresponding to the available fuse set as an available address, and activating an availability enable signal; a program enable circuit suitable for outputting, as a program enable signal, the duplication enable signal or the availability enable signal according to a program mode signal; and an address selection circuit suitable for outputting, as a fuse address, the duplication address or the available address according to the program mode signal.

In accordance with an embodiment of the present invention, a semiconductor memory device includes a memory array area including normal memory cells and redundant memory cells which replace defective memory cells among the normal memory cells; a non-volatile storage circuit including a plurality of fuse sets suitable for programming a repair address of the defective memory cells, and sequentially outputting fuse data according to a counting address, each fuse set including an enable fuse, a plurality of address fuses and a duplication fuse; a read control circuit suitable for receiving the fuse data, and outputting latch data by selectively masking data of the enable fuse and the address fuses using data of the duplication fuse within the received fuse data; and a latch circuit including a plurality of latches suitable for storing the latch data in response to a plurality of storing signals which are sequentially activated.

In accordance with an embodiment of the present invention, a method of operating a semiconductor device including a non-volatile storage circuit having a plurality of fuse sets each including an enable fuse, a plurality of address fuses and a duplication fuse, includes sequentially outputting fuse data from the fuse sets according to a counting address; storing the counting address corresponding to a duplicated fuse set among the fuse sets as a duplication address and activating a duplication enable signal when a repair address is identical to data of the address fuses within the duplicated fuse set; searching an available fuse set among the fuse sets according to data of the enable fuse, storing the counting address corresponding to the available fuse set as an available address, activating an availability enable signal; and programming the duplication fuse of the duplicated fuse set corresponding to the duplication address according to the duplication enable signal when a program mode signal is a first logic level, or programming the repair address into the available fuse set corresponding to the available address according to the availability enable signal when the program mode signal is a second logic level.

In accordance with an embodiment of the present invention, a method of operating a semiconductor device including a non-volatile storage circuit having a plurality of fuse sets each including an enable fuse, a plurality of address fuses and a duplication fuse, includes sequentially outputting fuse data from the fuse sets according to a counting address; outputting latch data by selectively masking data of the enable fuse and the address fuses using data of the duplication fuse among the fuse data; and storing the latch data into a plurality of latches in response to a plurality of storing signals which are sequentially activated.

In accordance with an embodiment of the present invention, a non-volatile storage device includes a first fuse set suitable for storing a first repair address; a program control circuit suitable for programming duplication data into the first fuse set when the first repair address is the same as a second repair address; and a read control circuit suitable for selectively masking the first repair address according to the duplication data to output the masked address as first latch data; wherein the program control circuit is further suitable for programming the second repair address into a second fuse set, and wherein the read control circuit is further suitable for outputting the second repair address as second latch data.

In accordance with an embodiment of the present invention, a non-volatile storage device includes plural fuse sets suitable for sequentially providing respective availability data stored therein according to a counting address, the availability data indicating a corresponding fuse set as available; a program control circuit suitable for programming a repair address into an available fuse set, which is selected among the fuse sets based on whether the sequentially provided availability data is set, while resetting the availability data stored in the selected fuse set; and a read control circuit suitable for outputting, as latch data, repair addresses programmed in the plural fuse sets.

BRIEF DESCRIPTION OF THE DRAWINGS

The above and other features and advantages of the present invention will become more apparent to those skilled in the art to which the present invention pertains by the following detailed description with reference to the attached drawings.

Figure 1:
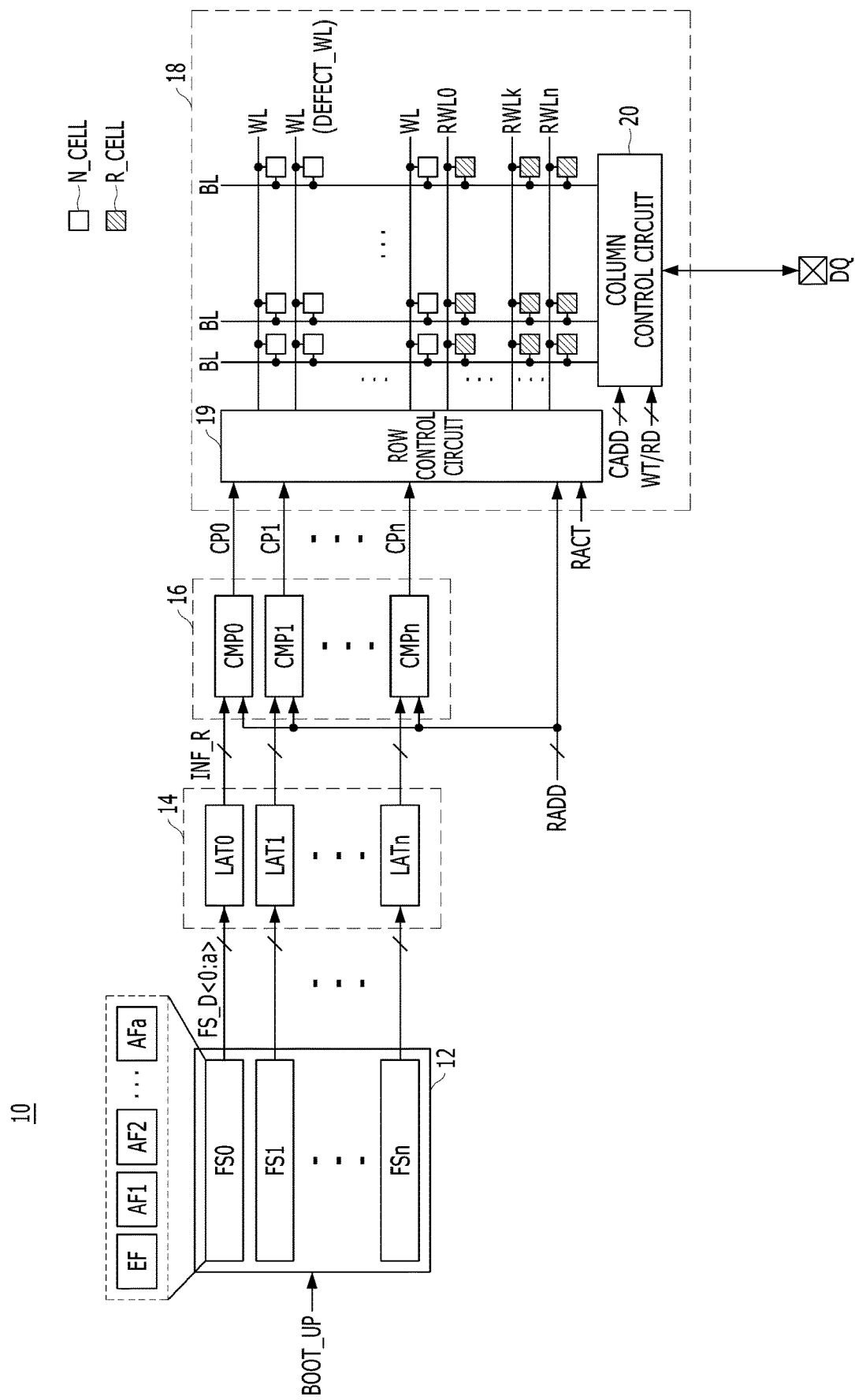
FIG. 1 is a block diagram illustrating a semiconductor memory device for performing a repair operation.

These and other features and advantages of the present disclosure will become apparent to those skilled in the art of the invention from the following detailed description in conjunction with the following drawings.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprising," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art, and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a semiconductor memory device 10 for performing a repair operation.

Referring to FIG. 1, the semiconductor memory device 10 may include a non-volatile storage circuit 12, a latch circuit 14, a repair control circuit 16, and a core region 18.

In the core region 18, a memory array area, a row control circuit 19 and a column control circuit 20 may be disposed. The memory array area may include a plurality of normal cells N_CELL and a plurality of redundant cells R_CELL. The normal cells N_CELL and the redundant cells R_CELL may be coupled between a plurality of word lines WL and RWL0 to RWLn, and a plurality of bit lines BL. The row control circuit 19 may activate a word line which is selected by a row address RADD or comparison signals CPO to CPn, in response to a row active signal RACT. When the row active signal RACT is activated, the row control circuit 19 may activate a normal word line WL corresponding to the row address RADD to access the normal cells N_CELL, or activate any of redundant word lines RWL0 to RWLn corresponding to an activated one of the comparison signals CPO to CPn to access the redundant cells R_CELL. The column control circuit 20 may output data of the bit lines BL which are selected by a column address RADD, to a data input/output pad DQ, according to a read command RD. The column control circuit 20 may transfer data provided through the data input/output pad DQ to the bit lines BL selected by the column address RADD, according to a write command WT.

Hereinafter, an embodiment will be described focusing on a row-related configuration and operation.

The non-volatile storage circuit 12 may include a plurality of fuse sets FS0 to FSn for programming a repair address for the memory array area. The plurality of fuse sets FS0 to FSn may respectively correspond to the redundant word lines RWL0 to RWLn. For example, the non-volatile storage circuit 12 may include first to 128-th fuse sets FS0 to FS127 respectively corresponding to first to 128-th redundant word lines RWL0 to RWL127. Each of the fuse sets FS0 to FSn may include an enable fuse EF and a plurality of address fuses AF1 to AFa. The enable fuse EF may denote information about whether the corresponding fuse set is programming a valid repair address. The plurality of address fuses AF1 to AFa may be provided with a number of fuses to program each bit of the repair address, in order to program the repair address to therein. The non-volatile storage circuit 12 may sequentially output fuse data FS_D<0:a> during an initialization operation (e.g., a boot-up operation) of a semiconductor memory device 10, according to a boot-up signal BOOT_UP.

The latch circuit 14 may include a plurality of latches LAT0 to LATn respectively corresponding to the fuse sets FS0 to FSn. During the boot-up operation, each of the plurality of latches LAT0 to LATn may store the fuse data FS_D<0:a> outputted from a corresponding one of the fuse sets FS0 to FSn, as repair information INF_R.

The repair control circuit 16 may include a plurality of comparators CMP0 to CMPn respectively corresponding to the latches LAT0 to LATn. The plurality of comparators CMP0 to CMPn may generate the comparison signals CPO to CPn by comparing the row address RADD with the repair information INF_R stored in the respective latches LAT0 to LATn. Each of the plurality of comparators CMP0 to CMPn may activate a corresponding comparison signal when the row address RADD matches the repair information INF_R.

The plurality of comparators CMP0 to CMPn may respectively correspond to the redundant word lines RWL0 to RWLn.

Based on the above description, concerns which occur when two identical repair addresses have been stored in the latch circuit 14, will be described.

During a manufacturing process, several test operations may be performed on the semiconductor memory device 10, and thus addresses of defective word lines detected for each test operation may be programmed in the non-volatile storage circuit 12, as the repair address. Here, the repair address of the defective word line DEFECT_WL was detected during more than two different test operations and programmed in duplicate to the non-volatile storage circuit 12.

When the semiconductor memory device 10 is initialized, the non-volatile storage circuit 12 may sequentially output the fuse data FS_D<0:a> according to the boot-up signal BOOT_UP. The latch circuit 14 may store the fuse data FS_D<0:a> as the repair information INF_R. The same repair information INF_R may be stored in at least two latches of the latch circuit 14.

After the initialization operation of the semiconductor memory device 10 is completed, the read/write command WT/RD, the row active signal RACT, the row address RADD, and the column address CADD are entered for a normal operation. The repair control circuit 16 may generate the comparison signals CP0 to CPn by comparing the row address RADD with the repair information INF_R. The repair control circuit 16 may access the normal Cells N_CELL by activating the normal word line WL corresponding to the row address RADD when the row active signal RACT is activated. The repair control circuit 16 may access the redundant cells R_CELL by activating any of the redundant word lines RWL0 to RWLn in response to the activated comparison signal, without activating the normal word lines WL.

At least two of the comparison signals CP0 to CPn may be simultaneously activated since at least two latches of the latch circuit 14 store the same repair information INF_R. For example, if the first latch LAT0 and the (k+1)th latch LATk store the same repair address of the defective word line DEFECT_WL, the first comparison signal CP0 and the (k+1)th comparison signal CPk may be activated simultaneously. Accordingly, both of the first redundant word line RWL0 and the (k+1)th redundant word line RWLk are activated simultaneously in the memory array area.

Figure 2A:
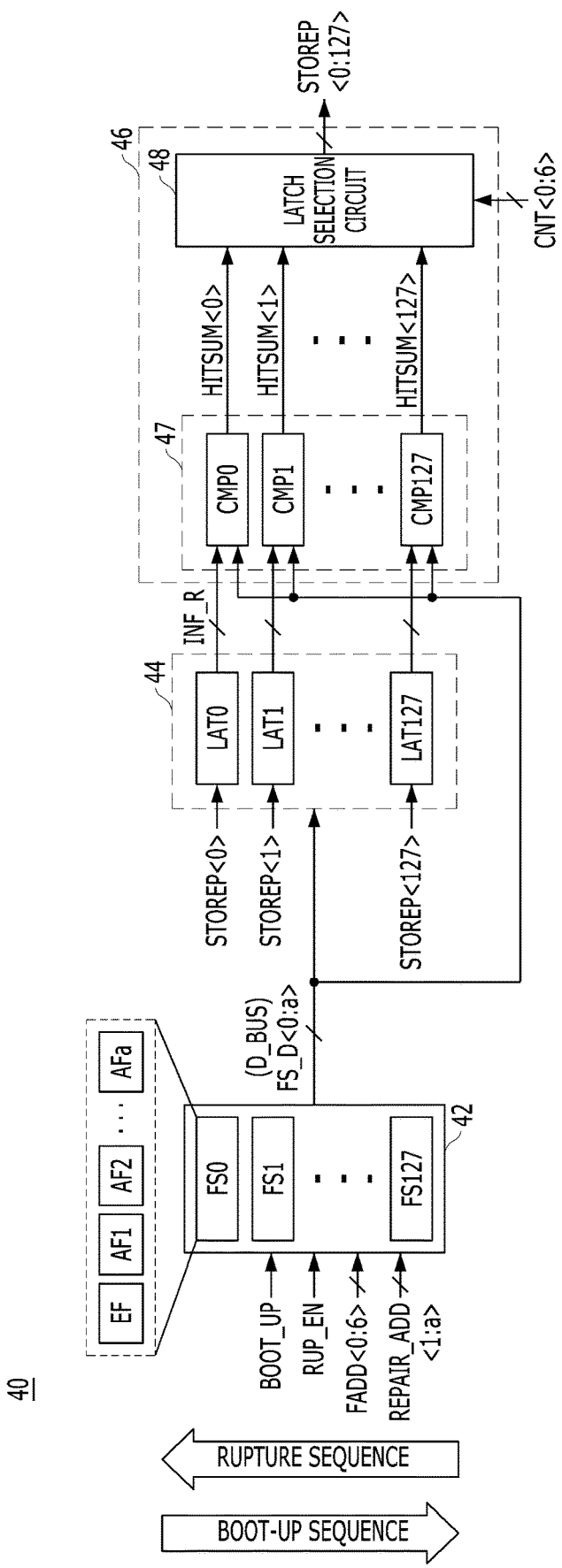
FIGS. 2A to 2C are diagrams illustrating a non-volatile storage device that controls not to store a duplicated repair address in a latch circuit.
Figure 2B:
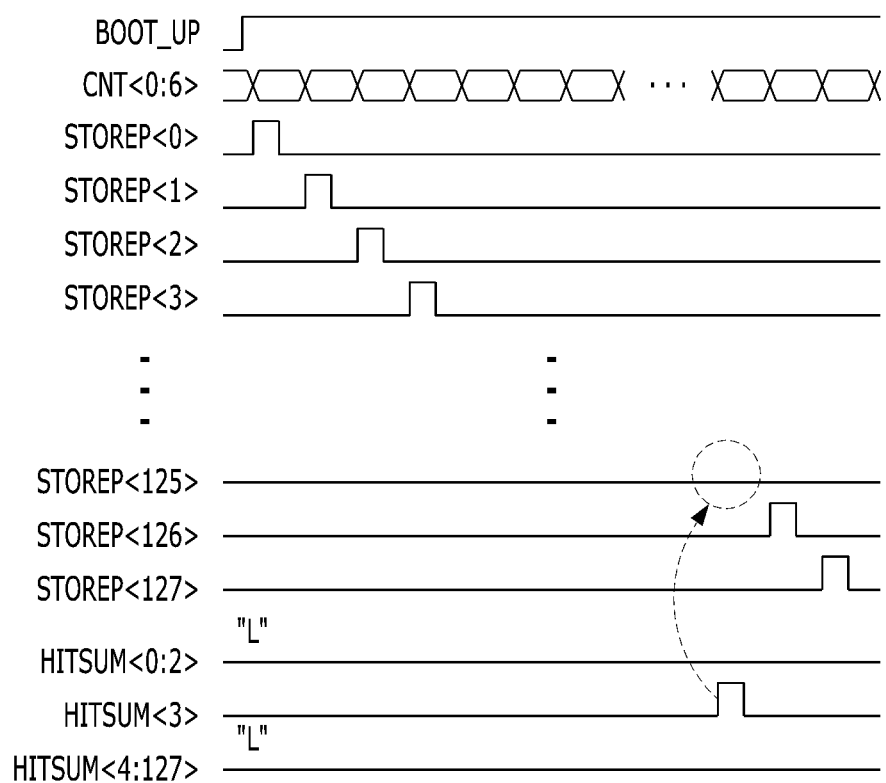
Figure 2C:
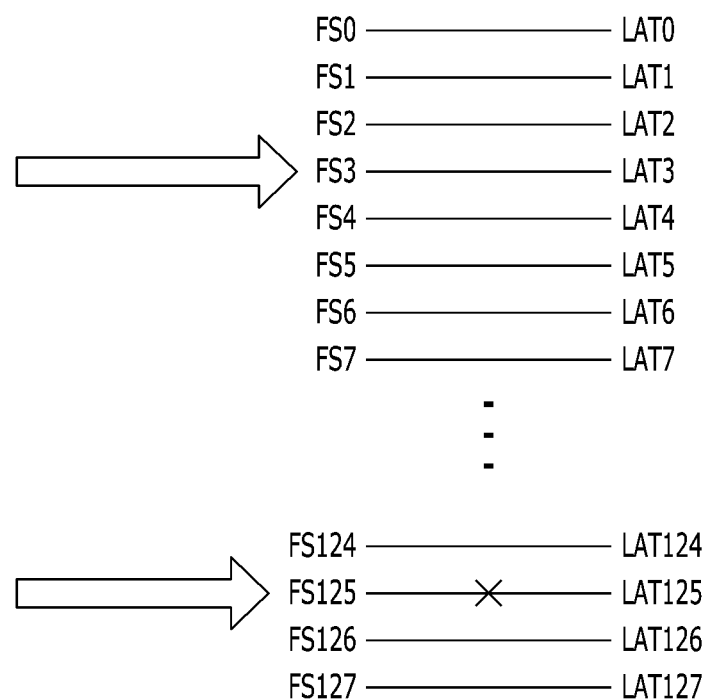

FIGS. 2A to 2C are diagrams illustrating a non-volatile storage device 40 that controls not to store duplicated fuse data in a latch circuit 44. FIGS. 2A to 2C illustrate a case where a non-volatile storage circuit 42 includes 128 fuse sets FS0 to FS127.

Referring to FIG. 2A, the non-volatile storage device 40 may include the non-volatile storage circuit 42, the latch circuit 44, and a latch control circuit 46.

The non-volatile storage circuit 42 may have the same configuration as that of the non-volatile storage circuit 12 of FIG. 1. The non-volatile storage circuit 42 may sequentially output fuse data FS_D<0:a> according to a boot-up signal BOOT_UP. In detail, the non-volatile storage circuit 42 may sequentially output the fuse data FS_D<0:a> corresponding to a fuse address FADD<0:6>, when the boot-up signal BOOT_UP is activated. The fuse address FADD<0:6> is configured as a 7-bit signal for designating each of first to 128-th fuse sets FS0 to FS127. The fuse address FADD<0:6> may be a signal sequentially increasing during a boot-up operation. The non-volatile storage circuit 42 may transfer the fuse data FS_D<0:a> to the latch circuit 44 through a data bus D_BUS. The non-volatile storage circuit 42 may program a repair address REPAIR_ADD<1:a> into a fuse set corresponding to the fuse address FADD<0:6>, according to a rupture signal RUP_EN. The fuse address FADD<0:6> may be a signal inputted from outside during a rupture operation.

The latch circuit 44 may have the same configuration as that of the latch circuit 14 of FIG. 1. First to 128-th latches LAT0 to LAT127 of the latch circuit 44 may store the fuse data FS_D<0:a> transferred through the data bus D_BUS, according to a corresponding signal of first to 128-th storing signals STOREP<0> to STOREP<127>. Each of the first to 128-th latches LAT0 to LAT127 may be enabled in response to the corresponding storing signal, and the enabled latch may receive and store the fuse data FS_D<0:a> transferred through the data bus D_BUS. For example, when the first storing signal STOREP<0> is activated, the first latch LAT0 receives and stores the fuse data FS_D<0:a> transferred through the data bus D_BUS, as repair information INF_R.

The latch control circuit 46 may include a comparison circuit 47 and a latch selection circuit 48. The comparison circuit 47 may include first to 128-th comparators CMP0 to CMP127 respectively corresponding to the first to 128-th latches LAT0 to LAT127. The first to 128-th comparators CMP0 to CMP127 may generate first to 128-th comparison signals HITSUM<0> to HITSUM<127> by comparing the fuse data FS_D<0:a> transferred through the data bus D_BUS, with the repair information INF_R stored in the first to 128-th latches LAT0 to LAT127, respectively. Each of the first to 128-th comparators CMP0 to CMP127 may activate a corresponding comparison signal when the fuse data FS_D<0:a> matches the repair information INF_R. The latch selection circuit 48 may generate the first to 128-th storing signals STOREP<0> to STOREP<127> which are sequentially activated, according to a counting signal CNT<0:6>, while deactivating a corresponding storing signal when any of the first to 128-th comparison signals HITSUM<0> to HITSUM<127> is activated. For example, the latch selection circuit 48 may activate the first storing signal STOREP<0> when the counting signal CNT<0:6> increases by +1, and activate the second storing signal STOREP<1> when the counting signal CNT<0:6> increases by +2. On the contrary, the latch selection circuit 48 may deactivate the third storing signal STOREP<2> if any of the first to 128-th comparison signals HITSUM<0> to HITSUM<127> is activated, even if the counting signal CNT<0:6> increases by +3.

In order to first use the finally programmed (i.e., ruptured) fuse data, the boot-up operation may be performed in an opposite direction to the rupture operation. For example, during the rupture operation, the repair address may be programmed in order from the 128-th fuse set FS127 to the first fuse set FS0. On the other hand, during the boot-up operation, the fuse data FS_D<0:a> may be transferred through the data bus D_BUS, in order from the first fuse set FS0 to the 128-th fuse set FS127. As a result, it is possible to store the finally programmed fuse data in the latch circuit 44 first, and to store the first programmed fuse data in the latch circuit 44 last.

Referring to FIGS. 2B and 2C, a method of controlling the latch circuit 44 not to store the duplicated fuse data during the boot-up operation will be described. Hereinafter, the duplicated repair address is programmed in the fourth fuse set FS3 and the 126-th fuse set FS125.

The non-volatile storage circuit 42 may sequentially output the fuse data FS_D<0:a> according to the fuse address FADD<0:6>, when the boot-up signal BOOT_UP is activated. During the boot-up operation, the fuse address FADD<0:6> increases from "0000000" for designating the first fuse set FS0 to "1111111" for designating the 128-th fuse set FS127. As a result, the non-volatile storage circuit 42 may output the fuse data FS_D<0:a> to the data bus D_BUS in order from the first fuse set FS0 to the 128-th fuse set FS127.

The latch selection circuit 48 may generate the first to 128-th storing signals STOREP<0> to STOREP<127> sequentially activated, according to the counting signal CNT<0:6>. The latch circuit 44 may store the fuse data FS_D<0:a> transferred through the data bus D_BUS, according to the first to 128-th storing signals STOREP<0> to STOREP<127>. That is, the fuse data FS_D<0:a>, which are outputted from the first to the 125-th fuse sets FS0 to FS124, are sequentially stored in from the first to the 125-th latches LAT0 to LAT124, respectively. When the fuse data FS_D<0:a> are transferred from the 126-th fuse set FS125 to the 126-th latch LAT125, the fourth comparator CMP3 may activate the fourth comparison signal HITSUM<3> by comparing the fuse data FS_D<0:a> transferred through the data bus D_BUS, with the repair information INF_R stored in the fourth latch LAT3. The latch selection circuit 48 may deactivate the 126-th storing signal STOREP<125> in response to the fourth comparison signal HITSUM<3>. Accordingly, the 126-th latch LAT125 does not store the FS_D<0:a> transferred from the 126-th fuse set FS125. As a result, the later programmed/ruptured fuse data (transferred from the fourth fuse set FS3) may be stored in the latch circuit 44, without storing the early programmed/ruptured but duplicated fuse data (transferred from the 126-th fuse set FS125) in the latch circuit 44.

As such, it is possible to avoid an abnormal operation resulting from the duplicated repair address by controlling not to store the duplicated fuse data when transferring the fuse data from the non-volatile storage circuit 42 to the latch circuit 44. However, with the above configuration, are restrictions in which the order of the boot-up operation should be performed in the opposite order of the rupture operation.

Hereinafter, a method of controlling a latch circuit not to store duplicated fuse data when storing the fuse data from a non-volatile storage circuit to the latch circuit, regardless of the order of the boot-up operation and a rupture operation, will be described.

In the following description, a rupture or program operation may mean an operation of programming data into a non-volatile storage circuit, a boot-up operation may mean an operation of reading out the programmed data from the non-volatile storage circuit, and a read operation may mean an operation of storing the read data in a latch circuit. The non-volatile storage circuit may be implemented with one selected from a group including an array e-fuse circuit, a NAND flash memory, a NOR flash memory, an Erasable Programmable Read Only Memory (EPROM), a Ferroelectric Random Access Memory (FRAM), and a Magnetic Random Access Memory (MRAM). Hereafter, as an example, the non-volatile storage circuit is composed of an array e-fuse circuit provided with 128 fuse sets FS0 to FS127.

Figure 3:
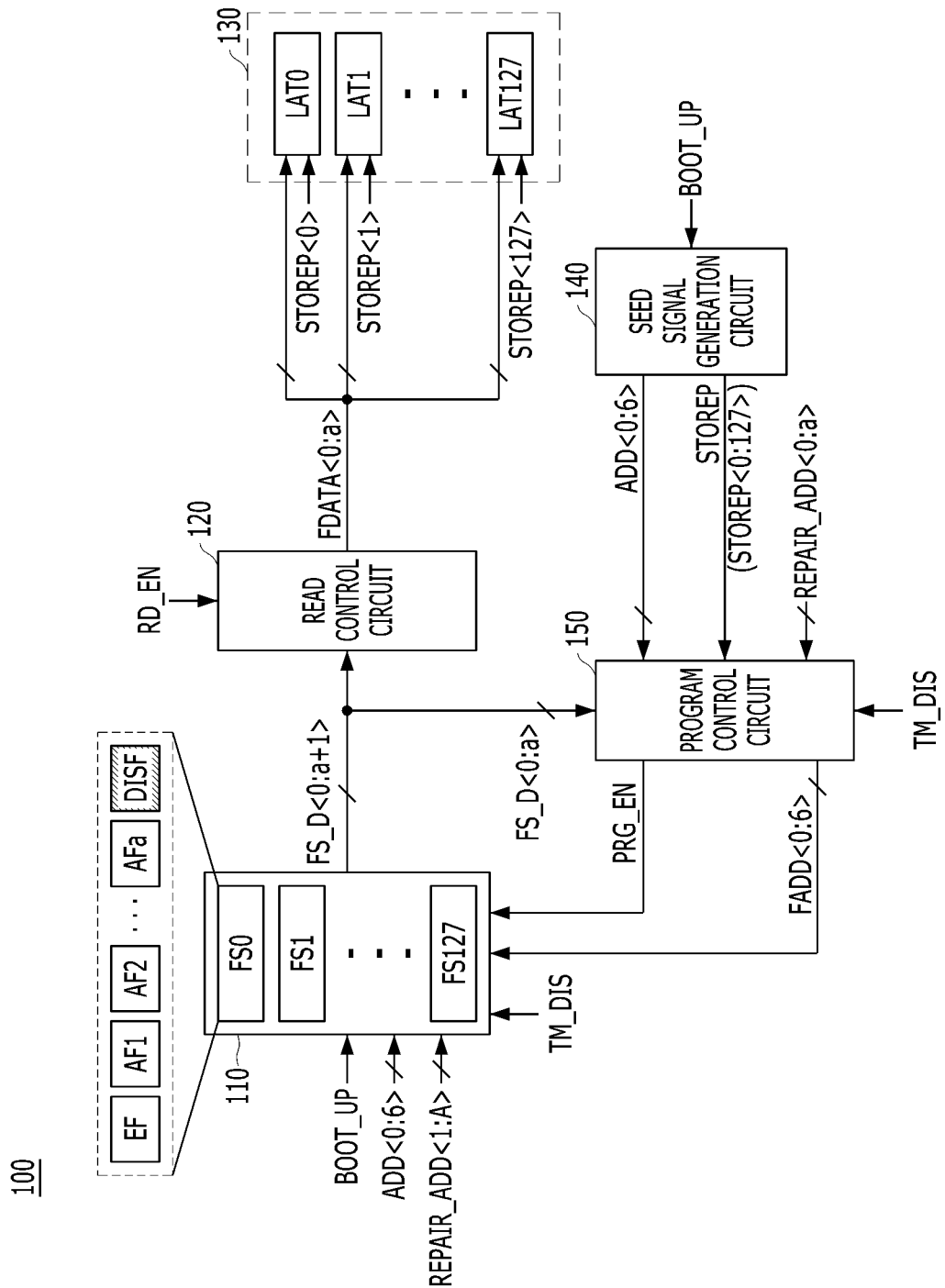
FIG. 3 is a block diagram illustrating a non-volatile storage device in accordance with an embodiment of the present invention.

FIG. 3 is a block diagram illustrating a non-volatile storage device 100 in accordance with an embodiment of the present invention.

Referring to FIG. 3, the non-volatile storage device 100 may include a non-volatile storage circuit 110, a read control circuit 120, a latch circuit 130, and a program control circuit 150. Further, the non-volatile storage device 100 may include a seed signal generation circuit 140.

The non-volatile storage circuit 110 may include first to 128-th fuse sets FS0 to FS127 for programming a repair address REPAIR_ADD<1:a>. In accordance with the embodiment of the present invention, each of the first to 128-th fuse sets FS0 to FS127 may include an enable fuse EF, a plurality of address fuses AF1 to AFa, and a duplication fuse DISF. The enable fuse EF may denote information about whether the corresponding fuse set is programming a valid repair address. The plurality of address fuses AF1 to AFa may be provided with a number of fuses to program each bit of the repair address REPAIR_ADD<1:a>, so as to program the repair address REPAIR_ADD<1:a> to therein. For example, each fuse set has first to 13th address fuses AF1 to AF13 when the repair address REPAIR_ADD<1:a> of 13 bits is configured (a=13). The duplication fuse DISF may denote duplication repair information about whether the programmed repair address in the corresponding fuse set is duplicated or not. For example, the duplication fuse DISF may be programmed by a high bit when the programmed repair address in the corresponding fuse set is duplicated and identical to a previously programmed repair address in another fuse set.

The non-volatile storage circuit 110 may perform a boot-up operation when a boot-up signal BOOT_UP is activated. During the boot-up operation, the non-volatile storage circuit 110 may sequentially output fuse data FS_D<0:a+1> according to a counting address ADD<0:6>. The counting address ADD<0:6> may be configured as a 7-bit signal for designating each of first to 128-th fuse sets FS0 to FS127, and may be sequentially increasing during the boot-up operation. For reference, due to the duplication fuse DISF, the fuse data FS_D<0:a+1> may be composed of (a+2) bits whose number is greater by 1 bit than the number of bits of the fuse data FS_D<0:a> of FIG. 2A. That is, in accordance with the embodiment of the present invention, during the boot-up operation, the non-volatile storage circuit 110 may transfer the fuse data FS_D<0:a+1> of (a+2) bits to a data bus D_BUS.

The read control circuit 120 may perform a read operation when a read enable signal RD_EN is activated. The read control circuit 120 may store the fuse data FS_D<0:a+1> transferred through the data bus D_BUS into the latch circuit 130. The read control circuit 120 may receive the fuse data FS_D<0:a+1> transferred through the data bus D_BUS, and output latch data FDATA<0:a> by selectively masking data FS_D<0:a> of the enable fuse EF and the address fuses AF1 to AFa, using data FS_D<a+1> of the duplication fuse DISF, among the fuse data FS_D<0:a+1>. For example, the read control circuit 120 may output the latch data FDATA<0:a> of all low bits when the data FS_D<a+1> of the duplication fuse DISF is a first logic level (e.g., a logic high level). The read control circuit 120 may output the data FS_D<0:a> of the enable fuse EF and the address fuses AF1 to AFa, as the latch data FDATA<0:a>, when the data FS_D<a+1> of the duplication fuse DISF is a second logic level (e.g., a logic low level). The latch data FDATA<0:a> may have a bit number less than that of the fuse data FS_D<0:a+1> by 1 bit.

The latch circuit 130 may include first to 128-th latches LAT0 to LAT127 respectively corresponding to the first to 128-th fuse sets FS0 to FS127. Each of the first to 128-th latches LAT0 to LAT127 may store the latch data FDATA<0:a> transferred from the read control circuit 120, according to a corresponding signal of first to 128-th storing signals STOREP<0> to STOREP<127>.

The seed signal generation circuit 140 may generate the counting address ADD<0:6>, a strobe signal STOREP, and the first to 128-th storing signals STOREP<0> to STOREP<127>, according to the boot-up signal BOOT_UP. The counting address ADD<0:6> may be a signal sequentially increasing during the boot-up operation to thereby select one of the fuse sets of the non-volatile storage circuit 110. The first to 128-th storing signals STOREP<0> to STOREP<127> may be sequentially activated, and may be activated after a certain delay whenever the counting address ADD<0:6> toggles. The strobe signal STOREP may be generated by performing a logic OR operation on the first to 128-th storing signals STOREP<0> to STOREP<127>.

The program control circuit 150 may compare the repair address REPAIR_ADD<1:a> inputted from outside, with the fuse data FS_D<0:a+1> transferred through the data bus D_BUS. The program control circuit 150 may compare the repair address REPAIR_ADD<1:a> with the data FS_D<0:a> except for the data FS_D<a+1> of the duplication fuse DISF, among the fuse data FS_D<0:a+1>. When the repair address REPAIR_ADD<1:a> is identical to the data FS_D<0:a>, the program control circuit 150 may control programming the duplication fuse DISF of the corresponding fuse set which has been outputting the fuse data FS_D<0:a+1>. Further, the program control circuit 150 may search an available fuse set among the first to 128-th fuse sets FS0 to FS127, and control programming the repair address REPAIR_ADD<1:a> into the available fuse set.

The program control circuit 150 may control programming the duplication fuse DISF of the corresponding fuse set, or programming the repair address REPAIR_ADD<1:a> into the available fuse set, according to a program mode signal TM_DIS. The program mode signal TM_DIS may be a signal for determining a program mode, and have a logic high level when programming the duplication fuse DISF of the corresponding fuse set, and have a logic low level when programming the repair address REPAIR_ADD<1:a> into the available fuse set. The program control circuit 150 may receive the counting address ADD<0:6> and the strobe signal STOREP from the seed signal generation circuit 140, in order to select one from the first to 128-th fuse sets FS0 to FS127. The program control circuit 150 may provide a program enable signal PRG_EN and a fuse address FADD<0:6> to the non-volatile storage circuit 110, in order to control a program operation of the non-volatile storage circuit 110.

When the program enable signal PRG_EN is activated, the non-volatile storage circuit 110 may program the repair address REPAIR_ADD<1:a> into the fuse set corresponding to the fuse address FADD<0:6> or program the duplication fuse DISF of the fuse set corresponding to the fuse address FADD<0:6> according to the program mode signal TM_DIS. The non-volatile storage circuit 110 may program the duplication fuse DISF of the fuse set when the program mode signal TM_DIS becomes a logic high level in a state that the program enable signal PRG_EN is activated. On the contrary, the non-volatile storage circuit 110 may program the repair address REPAIR_ADD<1:a> into the fuse set when the program mode signal TM_DIS becomes a logic low level in a state that the program enable signal PRG_EN is activated. Programming the repair address REPAIR_ADD<1:a> may mean programming the enable fuse EF to be set and programming the address fuses AF1 to AFa using the repair address REPAIR_ADD<1:a>. Hereinafter, as an example, it is assumed that the duplication fuse DISF and the enable fuse EF are programmed with a high bit to output a logic high level signal.

Figure 4:
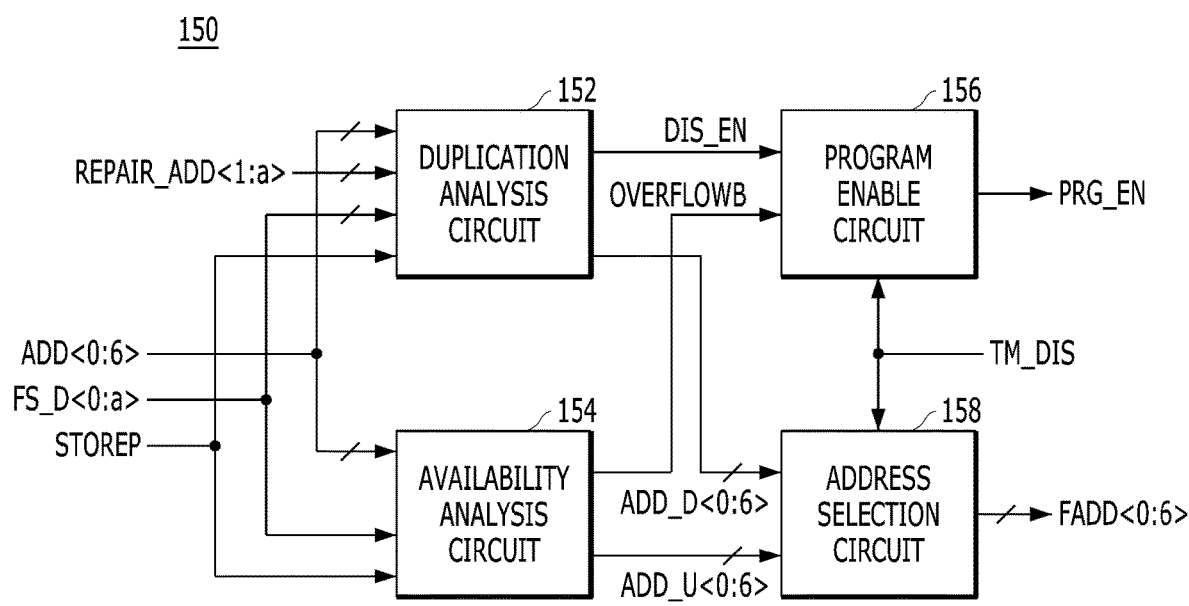
FIG. 4 is a detailed block diagram illustrating a program control circuit of FIG. 3, in accordance with an embodiment of the present invention.

FIG. 4 is a detailed block diagram illustrating the program control circuit 150 of FIG. 3, in accordance with an embodiment of the present invention.

Referring to FIG. 4, the program control circuit 150 may include a duplication analysis circuit 152, an availability analysis circuit 154, a program enable circuit 156, and an address selection circuit 158.

The duplication analysis circuit 152 may compare the repair address REPAIR_ADD<1:a> with the fuse data FS_D<0:a>. The duplication analysis circuit 152 may store the counting address ADD<0:6> as a duplication address ADD_D<0:6>, and activate a duplication enable signal DIS_EN when the repair address REPAIR_ADD<1:a> is identical to the fuse data FS_D<0:a>. The counting address ADD<0:6> may correspond to a fuse set which has been outputting the fuse data FS_D<0:a>. The duplication analysis circuit 152 may activate the duplication enable signal DIS_EN and latch the counting address ADD<0:6> to be stored as the duplication address ADD_D<0:6>, according to the strobe signal STOREP when the repair address REPAIR_ADD<1:a> is identical to the fuse data FS_D<0:a>.

The availability analysis circuit 154 may search one or more available fuse set according to data FS_D<0> of the enable fuse EF, among the fuse data FS_D<0:a> transferred through the data bus D_BUS. The availability analysis circuit 154 may store the counting address ADD<0:6> as an available address ADD_U<0:6>, and activate an availability enable signal OVERFLOWB. The availability analysis circuit 154 may activate the availability enable signal OVERFLOWB and latch the counting address ADD<0:6> to be stored as the available address ADD_U<0:6>, according to the strobe signal STOREP when any available fuse set has been searched.

The program enable circuit 156 may output, as the program enable signal PRG_EN, the duplication enable signal DIS_EN or the availability enable signal OVERFLOWB according to the program mode signal TM_DIS. For example, the program enable circuit 156 may select the duplication enable signal DIS_EN when the program mode signal TM_DIS is a logic high level, and may select the availability enable signal OVERFLOWB when the program mode signal TM_DIS is a logic low level.

The address selection circuit 158 may output, as the fuse address FADD<0:6>, the duplication address ADD_D<0:6> or the available address ADD_U<0:6> according to the program mode signal TM_DIS. For example, the address selection circuit 158 may select the duplication address ADD_D<0:6> when the program mode signal TM_DIS is a logic high level, and may select the available address ADD_U<0:6> when the program mode signal TM_DIS is a logic low level.

Figure 5:
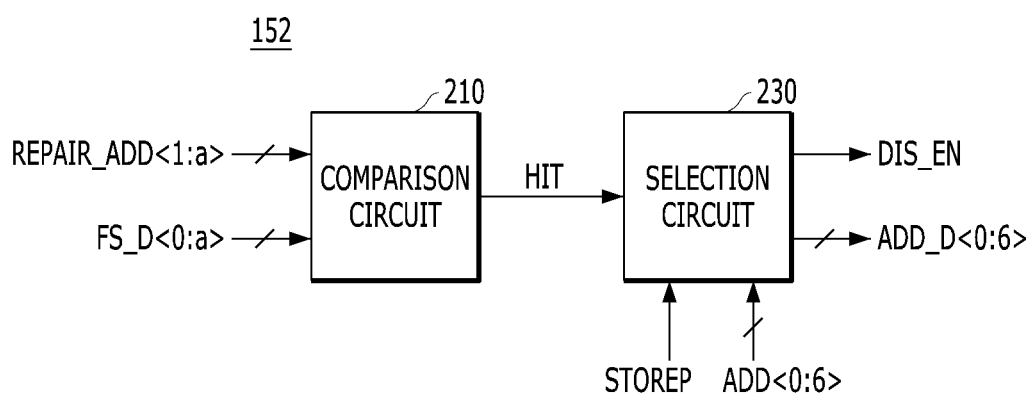
FIG. 5 is a detailed block diagram illustrating a duplication analysis circuit of FIG. 4.

FIG. 5 is a detailed block diagram illustrating the duplication analysis circuit 152 of FIG. 4.

Referring to FIG. 5, the duplication analysis circuit 152 may include a comparison circuit 210 and a selection circuit 230.

The comparison circuit 210 may compare the repair address REPAIR_ADD<1:a> with the fuse data FS_D<0:a> to generate a match signal HIT. For example, the comparison circuit 210 may generate the match signal HIT by comparing the repair address REPAIR_ADD<1:a> with data FS_D<1:a> of the address fuses AF1 to AFa when the data FS_D<0> of the enable fuse EF, among the fuse data FS_D<0:a>, is a logic high level. When the repair address REPAIR_ADD<1:

a> is identical to the data FS_D<1:a>, the comparison circuit 210 may output and activate the match signal HIT to a logic high level.

The selection circuit 230 may store the counting address ADD<0:6> as the duplication address ADD_D<0:6>, and activate the duplication enable signal DIS_EN, according to the match signal HIT. The selection circuit 230 may activate the duplication enable signal DIS_EN and latch the counting address ADD<0:6> to be stored as the duplication address ADD_D<0:6>, according to the strobe signal STOREP when the match signal HIT is activated.

Figure 6:
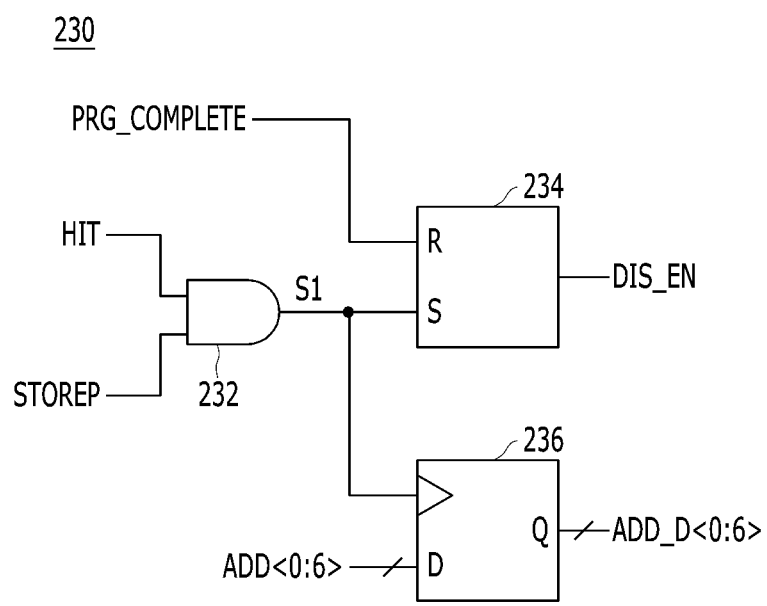
FIG. 6 is a circuit diagram illustrating a selection circuit of FIG. 5.

FIG. 6 is a circuit diagram illustrating the selection circuit 230 of FIG. 5.

Referring to FIG. 6, the selection circuit 230 may include a first AND gate 232, a first SR latch 234, and a first flip-flop 236. The first AND gate 232 may perform a logic AND operation on the match signal HIT and the strobe signal STOREP to output a first set signal S1. The first SR latch 234 may generate the duplication enable signal DIS_EN that is set by the first set signal S1 and reset by a program completion signal PRG_COMPLETE. For reference, the program completion signal PRG_COMPLETE may be activated after finishing the program operation of the non-volatile storage circuit 110 according to the program enable signal PRG_EN and fuse address FADD<0:6>. Depending on an embodiment, the program completion signal PRG_COMPLETE may be activated after a preset time from an activation of the program enable signal PRG_EN finishing the program operation, or be provided from the non-volatile storage circuit 110 after finishing the program operation. The first flip-flop 236 may latch the counting address ADD<0:6> according to the first set signal S1 to output the duplication address ADD_D<0:6>.

Figure 7:
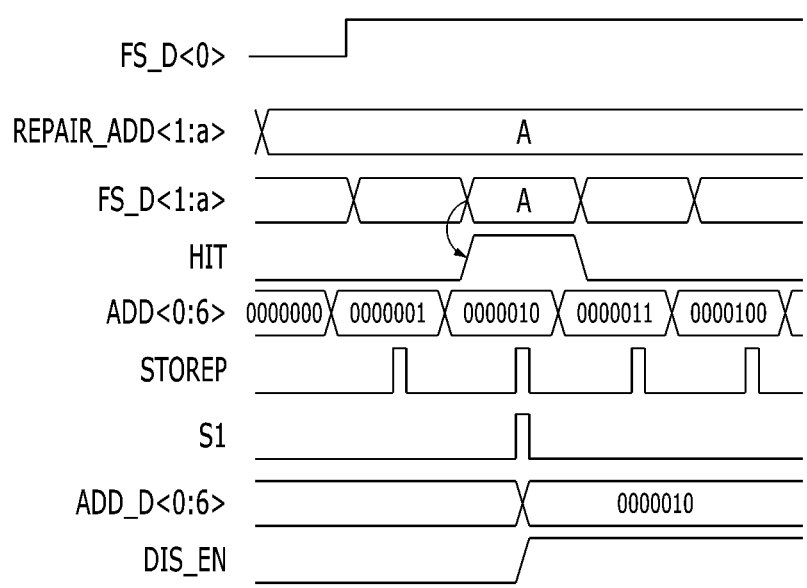
FIG. 7 is a timing diagram for describing an operation of the duplication analysis circuit of FIG. 5.

FIG. 7 is a timing diagram for describing an operation of the duplication analysis circuit 152 of FIG. 5.

Referring to FIG. 7, the comparison circuit 210 may compare the repair address REPAIR_ADD<1:a> with the fuse data FS_D<1:a> when the data FS_D<0> of the enable fuse EF, among the fuse data FS_D<0:a>, is a logic high level. The comparison circuit 210 may activate the match signal HIT when the repair address REPAIR_ADD<1:a> is identical to the data FS_D<1:a>. The selection circuit 230 may generate the first set signal S1 according to the strobe signal STOREP when the match signal HIT is activated. The selection circuit 230 may activate the duplication enable signal DIS_EN and store the counting address ADD<0:6> as the duplication address ADD_D<0:6>, according to the first set signal S1.

Figure 8:
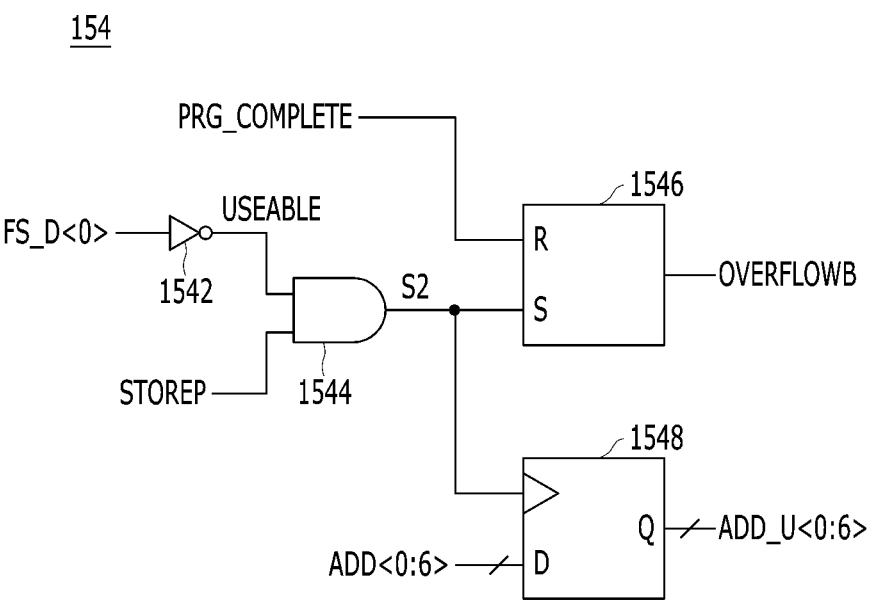
FIG. 8 is a circuit diagram illustrating an availability analysis circuit of FIG. 4.

FIG. 8 is a circuit diagram illustrating the availability analysis circuit 154 of FIG. 4.

Referring to FIG. 8, the availability analysis circuit 154 may include a first inverter 1542, a second AND gate 1544, a second SR latch 1546, and a second flip-flop 1548. The first inverter 1542 may invert the data FS_D<0> of the enable fuse EF to output an availability signal USEABLE. The second AND gate 1544 may perform a logic AND operation on the availability signal USEABLE and the strobe signal STOREP to output a second set signal S2. The second SR latch 1546 may generate the availability enable signal OVERFLOWB that is set by the second set signal S2 and reset by the program completion signal PRG_COMPLETE. The second flip-flop 1548 may latch the counting address ADD<0:6> according to the second set signal S2 to output the available address ADD_U<0:6>.

Figure 9:
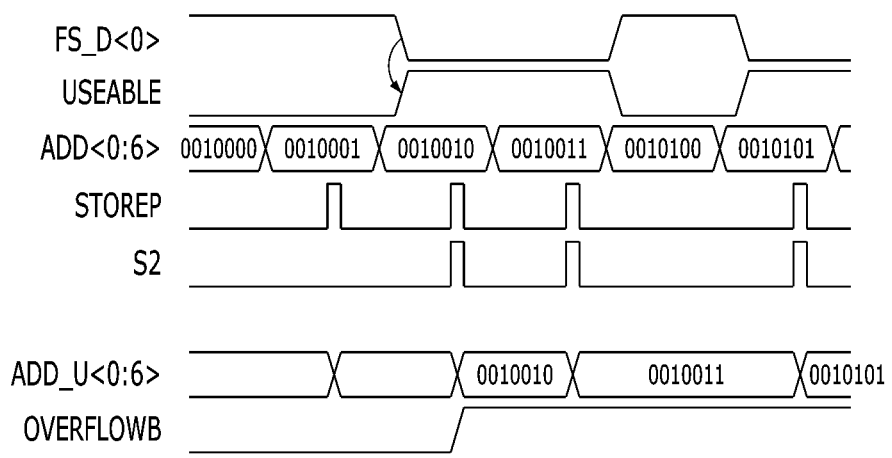
FIG. 9 is a timing diagram for describing an operation of the availability analysis circuit of FIG. 4.

FIG. 9 is a timing diagram for describing an operation of the availability analysis circuit 154 of FIG. 4.

Referring to FIG. 9, the availability analysis circuit 154 may invert the data FS_D<0> of the enable fuse EF to output the availability signal USEABLE. When the corresponding fuse set is used, i.e., the corresponding fuse set is programming a valid repair address, since the enable fuse EF is programmed with a high bit, the data FS_D<0> may be outputted to have a logic high level. On the contrary, when the corresponding fuse set is unused, since the enable fuse EF is programmed with a low bit, the data FS_D<0> may be outputted to have a logic low level. The availability analysis circuit 154 may output the availability signal USEABLE of a logic high level according to the data FS_D<0> of a logic low level.

The availability analysis circuit 154 may generate the second set signal S2 according to the strobe signal STOREP when the availability signal USEABLE is activated. The availability analysis circuit 154 may activate the availability enable signal OVERFLOWB and store the counting address ADD<0:6> as the available address ADD_U<0:6>, according to the second set signal S2. If the second set signal S2 is activated at any one time, the availability enable signal OVERFLOWB may remain in a set state (i.e. a logic high level). On the other hand, if all fuse sets are in use, the second set signal S2 is not activated and the availability enable signal OVERFLOWB may maintain a logic low level.

Meanwhile, the second set signal S2 may be activated by the number of times corresponding to the number of available fuse sets. The availability analysis circuit 154 may output a valid available address ADD_U<0:6> in response to the last activation of the second set signal S2. That is, since the counting address ADD<0:6> is sequentially increasing, the available fuse set may be selected in order from the 128-th fuse set FS127 to the first fuse set FS0. However, the concept and spirit of the present invention are not limited thereto. According to an embodiment, the availability analysis circuit 154 may be designed to output a valid available address ADD_U<0:6> in response to the first activation of the second set signal S2. In this case, the available fuse set may be selected in order from the first fuse set FS0 to the 128-th fuse set FS127. Accordingly, the sequence of the program operation may not be limited to a particular direction.

Figure 10:
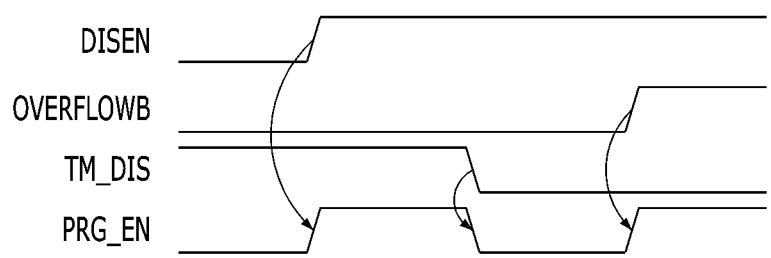
FIG. 10 is a timing diagram for describing an operation of a program enable circuit of FIG. 4.

FIG. 10 is a timing diagram for describing an operation of the program enable circuit 156 of FIG. 4.

Referring to FIG. 10, the program enable circuit 156 may output, as the program enable signal PRG_EN, the duplication enable signal DIS_EN when the program mode signal TM_DIS is a logic high level. The program enable circuit 156 may output, as the program enable signal PRG_EN, the availability enable signal OVERFLOWB when the program mode signal TM_DIS is a logic low level.

Figure 11:
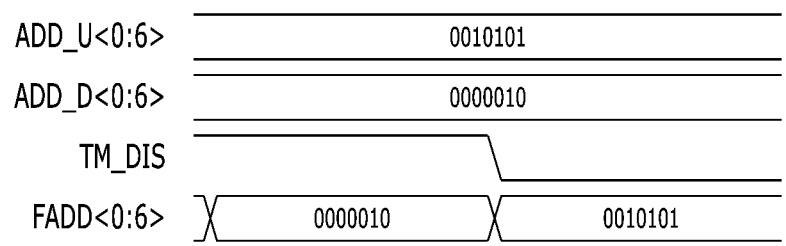
FIG. 11 is a timing diagram for describing an operation of an address selection circuit of FIG. 4.

FIG. 11 is a timing diagram for describing an operation of the address selection circuit 158 of FIG. 4.

Referring to FIG. 11, the address selection circuit 158 may output, as the fuse address FADD<0:6>, the duplication address ADD_D<0:6> when the program mode signal TM_DIS is a logic high level. The address selection circuit 158 may output, as the fuse address FADD<0:6>, the available address ADD_U<0:6> when the program mode signal TM_DIS is a logic low level.

Hereinafter, referring to FIGS. 3 to 13, an operation of a non-volatile storage device in accordance with various embodiments of the present invention will be described.

Figure 12:
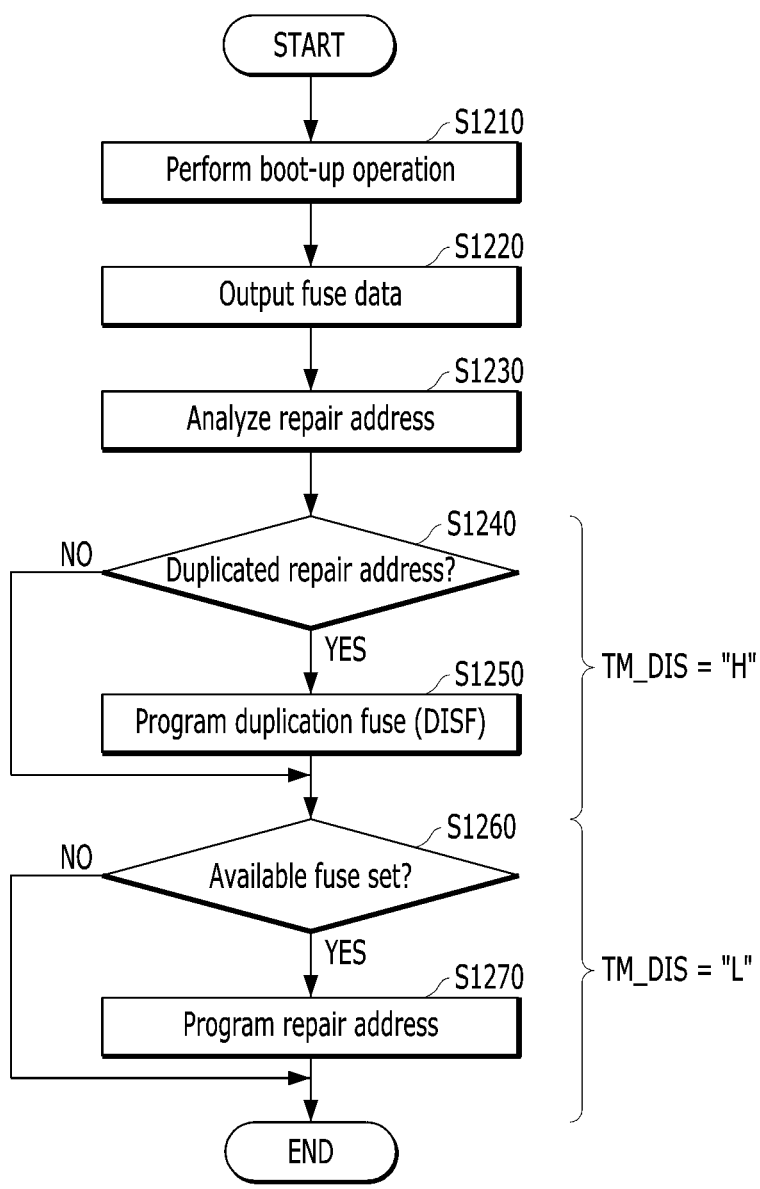
FIG. 12 is a flow chart for describing a program operation of a non-volatile storage device in accordance with an embodiment of the present invention.

FIG. 12 is a flow chart for describing a program operation of a non-volatile storage device in accordance with an embodiment of the present invention.

Referring to FIG. 12, a boot-up operation is performed according to a boot-up signal BOOT_UP (at step S1210). The non-volatile storage device 110 sequentially outputs fuse data FS_D<0:a+1> according to a counting address ADD<0:6> (at step S1220). The non-volatile storage device 110 may transfer the fuse data FS_D<0:a+1> of (a+2) bits to a data bus D_BUS. Since a read enable signal RD_EN is deactivated, the read control circuit 120 becomes disabled.

The seed signal generation circuit 140 generates the counting address ADD<0:6> and a strobe signal STOREP according to the boot-up signal BOOT_UP. The program control circuit 150 analyzes a repair address REPAIR_ADD<1:a> inputted from outside (at step S1230).

The duplication analysis circuit 152 compares the repair address REPAIR_ADD<1:a> with the fuse data FS_D<0:a>. If the repair address REPAIR_ADD<1:a> is identical to the fuse data FS_D<0:a> ("YES" of step S1240), the duplication analysis circuit 152 determines that there is at least one duplicated address. The duplication analysis circuit 152 activates a duplication enable signal DIS_EN and stores the counting address ADD<0:6> as a duplication address ADD_D<0:6>, according to the strobe signal STOREP. When a program mode signal TM_DIS is a logic high level, the program enable circuit 156 outputs, as a program enable signal PRG_EN, the duplication enable signal DIS_EN and the address selection circuit 158 outputs, as a fuse address FADD<0:6>, the duplication address ADD_D<0:6>. The non-volatile storage circuit 110 may program a duplication fuse DISF of a fuse set corresponding to the fuse address FADD<0:6>, when the program mode signal TM_DIS becomes a logic high level in a state that the program enable signal PRG_EN is activated (at step S1250).

If the repair address REPAIR_ADD<1:a> is different from the fuse data FS_D<0:a> ("NO" of step S1240), the duplication analysis circuit 152 determines that there is no duplicated address so as not to program any duplication fuse DISF.

Meanwhile, the availability analysis circuit 154 searches one or more available fuse set according to data FS_D<0> of an enable fuse EF, among the fuse data FS_D<0:a> transferred through the data bus D_BUS. If any available fuse set has been searched ("YES" of step S1260), the availability analysis circuit 154 activates an availability enable signal OVERFLOWB and stores the counting address ADD<0:6> as an available address ADD_U<0:6>, according to the strobe signal STOREP. When the program mode signal TM_DIS is a logic low level, the program enable circuit 156 outputs, as the program enable signal PRG_EN, the availability enable signal OVERFLOWB, and the address selection circuit 158 outputs, as the fuse address FADD<0:6>, the available address ADD_U<0:6>. The non-volatile storage circuit 110 may program the repair address REPAIR_ADD<1:a> into a fuse set corresponding to the fuse address FADD<0:6>, when the program mode signal TM_DIS becomes a logic low level in a state that the program enable signal PRG_EN is activated (at step S1270).

If all fuse sets are in use and thus the data FS_D<0> of all enable fuses EF have a logic high level ("NO" of step S1260), the availability analysis circuit 154 determines that there are no available fuse sets so as not to program the repair address REPAIR_ADD<1:a>. In this case, chips or packages including the non-volatile storage device may be judged by a chip kill and discarded.

Figure 13:
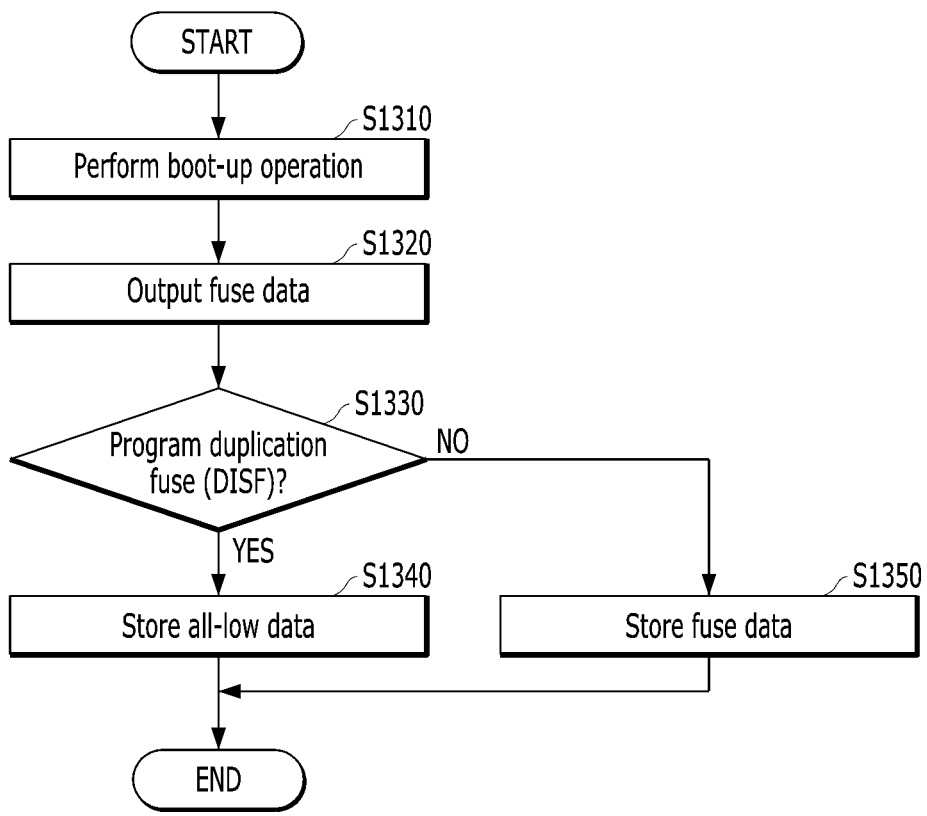
FIG. 13 is a flow chart for describing a read operation of a non-volatile storage device in accordance with an embodiment of the present invention.

FIG. 13 is a flow chart for describing a read operation of a non-volatile storage device in accordance with an embodiment of the present invention.

Referring to FIG. 13, a boot-up operation is performed according to a boot-up signal BOOT_UP (at step S1310). The non-volatile storage device 110 sequentially outputs fuse data FS_D<0:a+1> according to a counting address ADD<0:6> (at step S1320). The non-volatile storage device 110 may transfer the fuse data FS_D<0:a+1> of (a+2) bits to a data bus D_BUS. Since a repair address REPAIR_ADD<1:a> is not inputted, the program control circuit 150 becomes disabled.

The read control circuit 120 is enabled according to a read enable signal RD_EN to receive the fuse data FS_D<0:a+1> transferred through the data bus D_BUS. When data FS_D<a+1> of a duplication fuse DISF is a logic high level ("YES" of step S1330), the read control circuit 120 determines that the fuse data FS_D<0:a+1> are duplicated and outputs latch data FDATA<0:a> of all low bits to be stored in the latch circuit 130 (at step S1340). On the contrary, if the data FS_D<a+1> of the duplication fuse DISF is a logic low level ("NO" of step S1330), the read control circuit 120 determines that the fuse data FS_D<0:a+1> are not duplicated and outputs data FS_D<0:a> of an enable fuse EF and address fuses AF1 to AFa, as the latch data FDATA<0:a>, to be stored in the latch circuit 130 (at step S1350).

As described above, the non-volatile storage device in accordance with an embodiment of the proposed invention may program a duplication fuse DISF to a non-volatile storage circuit, as well as an enable fuse EF and address fuses AF1 to AFa, to a non-volatile storage circuit, wherein the duplication fuse DISF has duplication repair information about whether a programmed repair address in a corresponding fuse set is duplicated or not. Further, according to the duplication repair information, when storing the repair address in a latch circuit, the non-volatile storage device may control not to store the duplicated repair address. A program operation can be performed regardless of the sequence of boot-up operation (or read operation) to enhance performance by improving repair efficiency and reducing errors.

Figure 14:
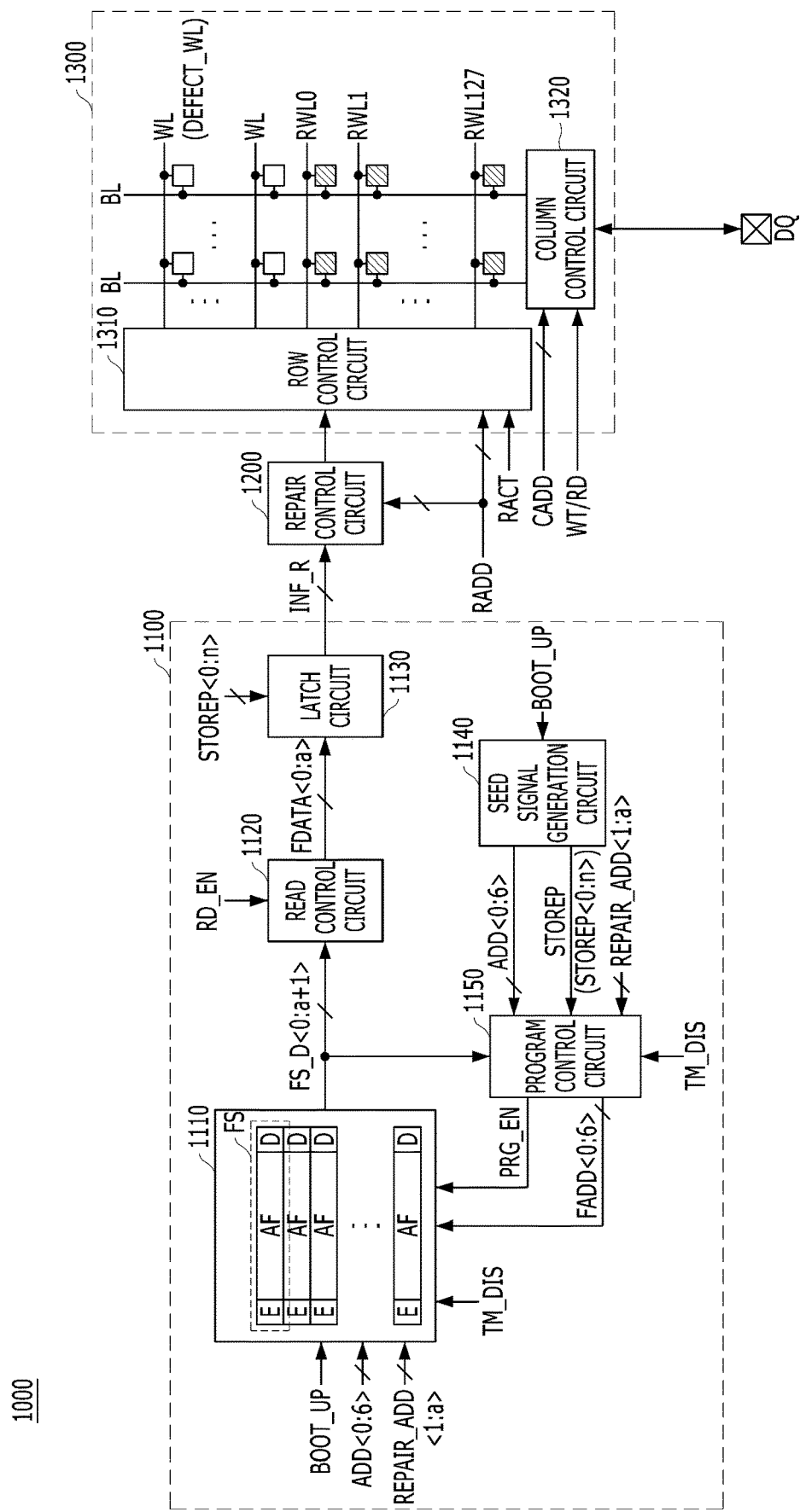
FIG. 14 is a block diagram illustrating a semiconductor memory device in accordance with an embodiment of the present invention.

FIG. 14 is a block diagram illustrating a semiconductor memory device 1000 in accordance with an embodiment of the present invention.

Referring to FIG. 14, the semiconductor memory device 1000 may include a non-volatile storage device 1100, a repair control circuit 1200, and a core region 1300.

In the core region 1300, a memory array area, a row control circuit 1310 and a column control circuit 1320 may be disposed. Since each configuration of the core area 1300 of FIG. 12 is substantially the same as that of the core area 18 of FIG. 1, a detailed description is omitted. Similarly, since the repair control circuit 1200 of FIG. 12 is substantially the same as the repair control circuit 16 of FIG. 1, a detailed description is omitted.

The non-volatile storage device 1100 may include a non-volatile storage circuit 1110, a read control circuit 1120, a latch circuit 1130, a seed signal generation circuit 1140, and a program control circuit 1150. Each configuration of the non-volatile storage device 1100 of FIG. 12 is substantially the same as that of the non-volatile storage device 100 of FIG. 3. That is, the non-volatile storage circuit 110 may include first to 128-th fuse sets FS0 to FS127 for programming a repair address REPAIR_ADD<1:a>. In accordance with an embodiment of the present invention, each of the first to 128-th fuse sets FS0 to FS127 may include an enable fuse EF, a plurality of address fuses AF1 to AFa, and a duplication fuse DISF. During a program operation, the program control circuit 1150 may control programming duplication repair information about whether or not a programmed repair address in a corresponding fuse set is duplicated, into the duplication fuse DISF of the corresponding fuse set. During a read operation when storing the fuse data FS_D<0:a> into the latch circuit 1130, the read control circuit 1120 may selectively mask data FS_D<0:a> of the enable fuse EF and the address fuses AF1 to AFa, using data FS_D<a+1> (i.e., duplication repair information) of the duplication fuse DISF, among the fuse data FS_D<0:a+1>. Accordingly, the non-volatile storage device 1100 may control not to store the duplicated repair address into the latch circuit 1130.

Meanwhile, the memory array area in the core region 1300 may include a plurality of banks BK0 to BKm which are divided by a plurality of cell matrices (hereinafter referring to as "cell mats").

Figure 15:
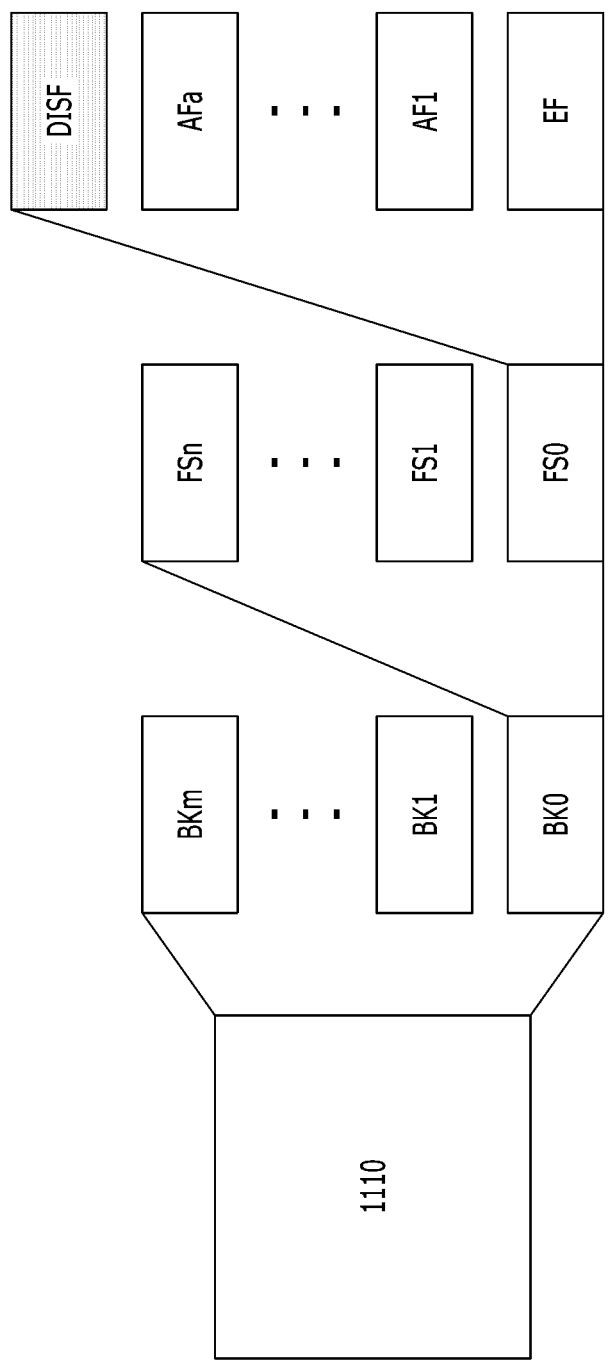
FIG. 15 is a diagram for describing a configuration of a non-volatile storage circuit in accordance with an embodiment of the present invention.

FIG. 15 is a diagram for describing a configuration of the non-volatile storage circuit 1110 in accordance with an embodiment of the present invention.

Referring to FIG. 15, the non-volatile storage circuit 1110 may have a plurality of areas corresponding to a plurality of banks BK0 to BKm of the memory array area in the core region 1300. In each area, a plurality of fuse sets FS0 to FSn may be disposed. For reference, the number of the fuse sets FS0 to FSn may correspond to the number of redundant word lines RWL0 to RWLn disposed per bank. In the present invention, each of the fuse sets FS0 to FSn may include an enable fuse EF, a plurality of address fuses AF1 to AFa, and a duplication fuse DISF.

Figure 16:
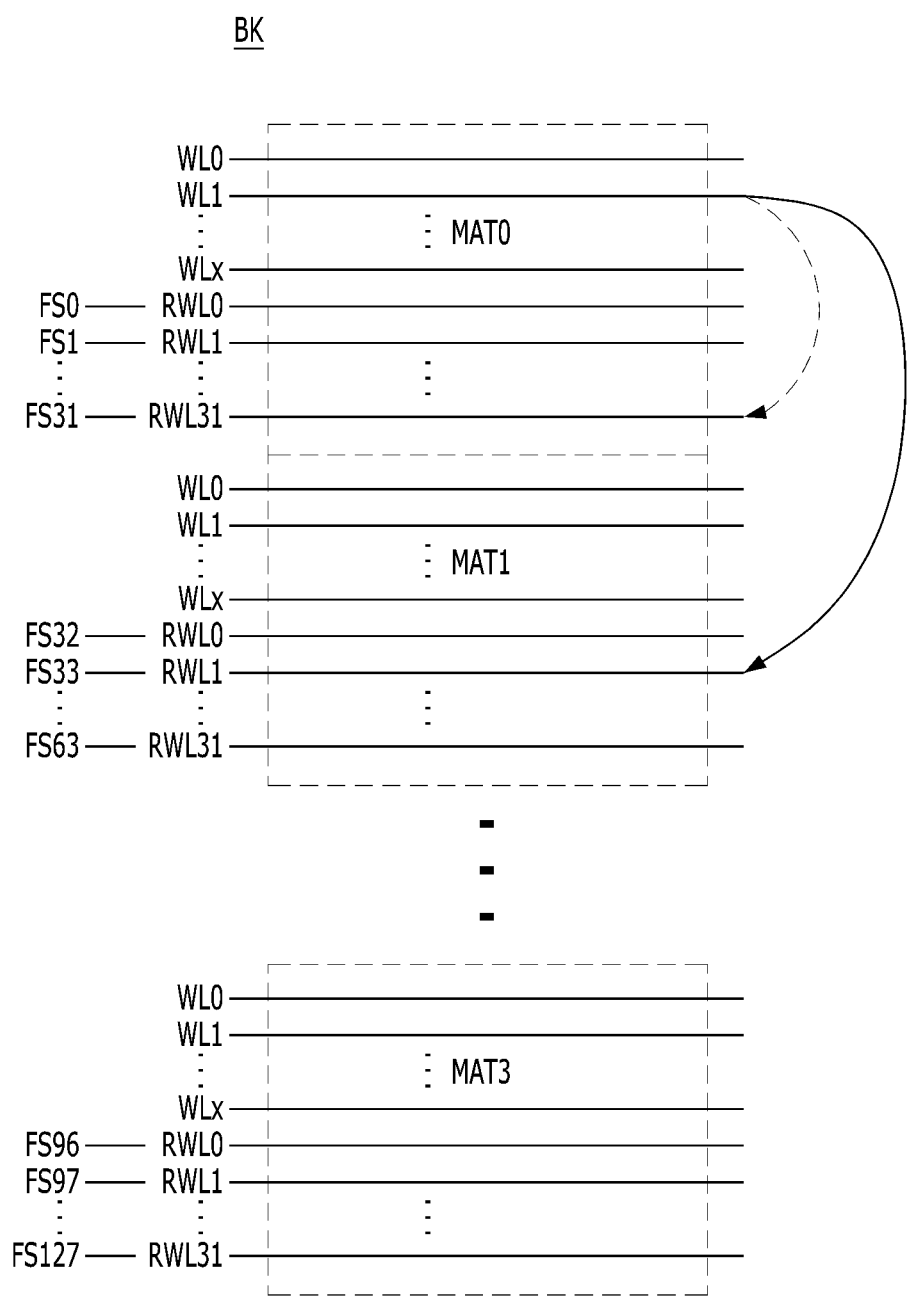
FIG. 16 is a diagram for describing a structure of cell mats disposed in each bank.

FIG. 16 is a diagram for describing a structure of cell mats disposed in each bank BK.

Referring to FIG. 16, each bank BK may include a plurality of cell mats. FIG. 16 illustrates first to fourth cell mats MAT0 to MAT3. Each of the first to fourth cell mats MAT0 to MAT3 may include a plurality of normal word lines WL0 to WLx coupled to normal cells, and a plurality of redundant word lines RWL0 to RWL31 coupled to redundant cells. When 128 redundant word lines are allocated to each bank BK0, 32 redundant word lines are allocated to each of the first to fourth cell mats MAT0 to MAT3. As shown in FIG. 16, the number of redundant word lines disposed per bank BK may correspond to the number of fuse sets FS0 to FS128.

In general, if a repair target word line (i.e., a defective word line), among the normal word lines WL0 to WLx disposed in a particular cell mat, is detected, the defective word line may be replaced with any of the redundant word lines RWL0 to RWL31 disposed in any of the first to fourth cell mats MAT0 to MAT3, not one of the particular cell mat. For example, if the second normal word line WL1 of the first cell mat MAT0 is detected as a defective word line, the second normal word line WL1 may be replaced with the second redundant word lines RWL1 of the second cell mat MAT1, despite the presence of the replaceable redundant word lines RWL31 of the first cell mat MAT0. That is, despite the presence of the replaceable redundant word line of the same mat, the defective word line is replaced with the redundant word line of any cell mat. This may cause the efficiency of a repair operation to deteriorate.

Hereinafter, in accordance with another embodiment of the present invention, a method for programming a repair address by first searching, among a plurality of fuse sets, a fuse set corresponding to a redundant word line of a specific cell mat in which a defective word line exists (hereinafter referred to as a "fail mat"), will be described.

Figure 17:
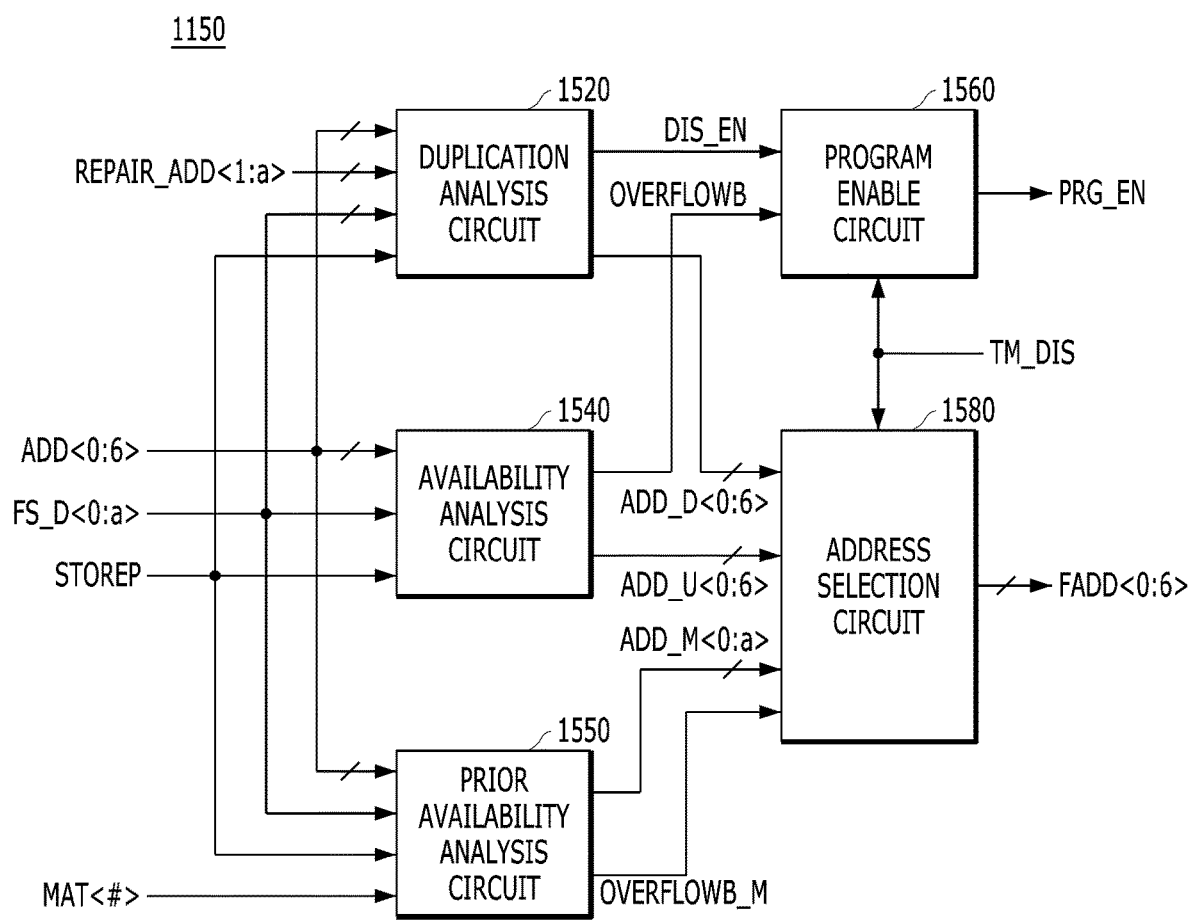
FIG. 17 is a detailed block diagram illustrating a program control circuit of FIG. 14, in accordance with another embodiment of the present invention.

FIG. 17 is a detailed block diagram illustrating the program control circuit 1150 of FIG. 14, in accordance with another embodiment of the present invention.

Referring to FIG. 17, the program control circuit 1150 may include a duplication analysis circuit 1520, an availability analysis circuit 1540, a prior availability analysis circuit 1550, a program enable circuit 1560, and an address selection circuit 1580.

The duplication analysis circuit 1520, the availability analysis circuit 1540, and the program enable circuit 1560 may have substantially the same configuration and operation of the duplication analysis circuit 152, the availability analysis circuit 154, and the program enable circuit 156 of FIG. 4.

The prior availability analysis circuit 1550 may determine fuse sets corresponding to redundant word lines disposed in a fail mat, according to mat information MAT<#> and a counting address ADD<0:6>. The mat information MAT<#> may include information about which mat the fail mat is. The counting address ADD<0:6> may indicate a position of the fuse sets of the non-volatile storage circuit 1110. The prior availability analysis circuit 1550 may search one or more available fuse set from the determined fuse sets, according to data FS_D<0> of an enable fuse EF, among fuse data FS_D<0:a>. The prior availability analysis circuit 1550 may store the counting address ADD<0:6> as a priorly available address ADD_M<0:6>, and activate a prior availability enable signal OVERFLOWB_M, when any available fuse set has been searched in the determined fuse sets. The prior availability analysis circuit 1550 may activate the prior availability enable signal OVERFLOWB_M and latch the counting address ADD<0:6> to be stored as the priorly available address ADD_M<0:6>, according to the strobe signal STOREP when any available fuse set has been searched in the determined fuse sets.

The address selection circuit 1580 may select one of the available address ADD_U<0:6> and the priorly available address ADD_M<0:6> according to the prior availability enable signal OVERFLOWB_M. Then, the address selection circuit 1580 may select and output, as a fuse address FADD<0:6>, the selected available address or the duplication address ADD_D<0:6> according to the program mode signal TM_DIS. The address selection circuit 1580 may select the duplication address ADD_D<0:6> when the program mode signal TM_DIS is a logic high level. The address selection circuit 1580 may select one of the available address ADD_U<0:6> and the priorly available address ADD_M<0:6> according to the prior availability enable signal OVERFLOWB_M when the program mode signal TM_DIS is a logic low level.

Figure 18:
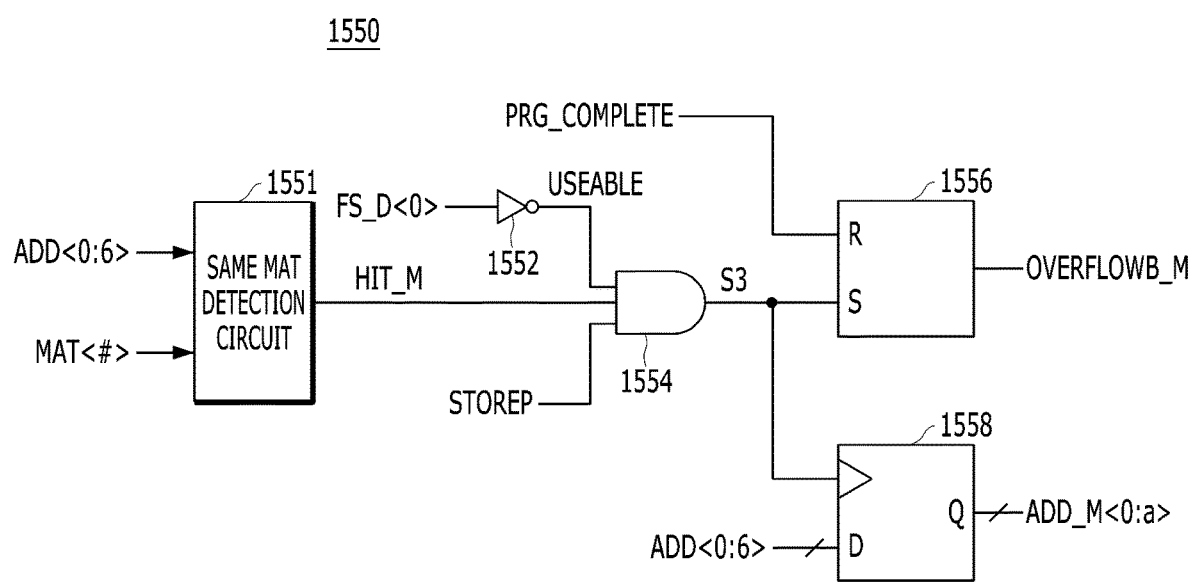
FIG. 18 is a circuit diagram illustrating a prior availability analysis circuit of FIG. 17.

FIG. 18 is a circuit diagram illustrating the prior availability analysis circuit 1550 of FIG. 17.

Referring to FIG. 18, the prior availability analysis circuit 1550 may include a same mat detection circuit 1551, a second inverter 1552, a third AND gate 1554, a third SR latch 1556, and a third flip-flop 1558.

The same mat detection circuit 1551 may receive the mat information MAT<#> and the counting address ADD<0:6>, detect whether a fuse set corresponding to the counting address ADD<0:6> corresponds to the redundant word lines disposed in the fail mat, and output a same mat signal HIT_M. For example, in case where the fail mat is a second mat (MAT1 of FIG. 16), the same mat detection circuit 1551 may activate the same mat signal HIT_M to a logic high level when the fuse set corresponding to the counting address ADD<0:6> is any of the fuse sets FS32 to FS63 of FIG. 1.

The second inverter 1552 may invert the data FS_D<0> of the enable fuse EF to output an availability signal USEABLE. The third AND gate 1554 may perform a logic AND operation on the same mat signal HIT_M, the availability signal USEABLE and the strobe signal STOREP to output a third set signal S3. The third SR latch 1556 may generate the prior availability enable signal OVERFLOWB_M that is set by the third set signal S3 and reset by a program completion signal PRG_COMPLETE. The third flip-flop 1558 may latch the counting address ADD<0:6> according to the third set signal S3 to output the priorly available address ADD_M<0:6>.

Hereinafter, referring to FIGS. 14 to 19, a program operation of a semiconductor memory device in accordance with various embodiments of the present invention will be described. For reference, a read operation of the semiconductor memory device may be substantially the same as that of FIG. 13.

Figure 19:
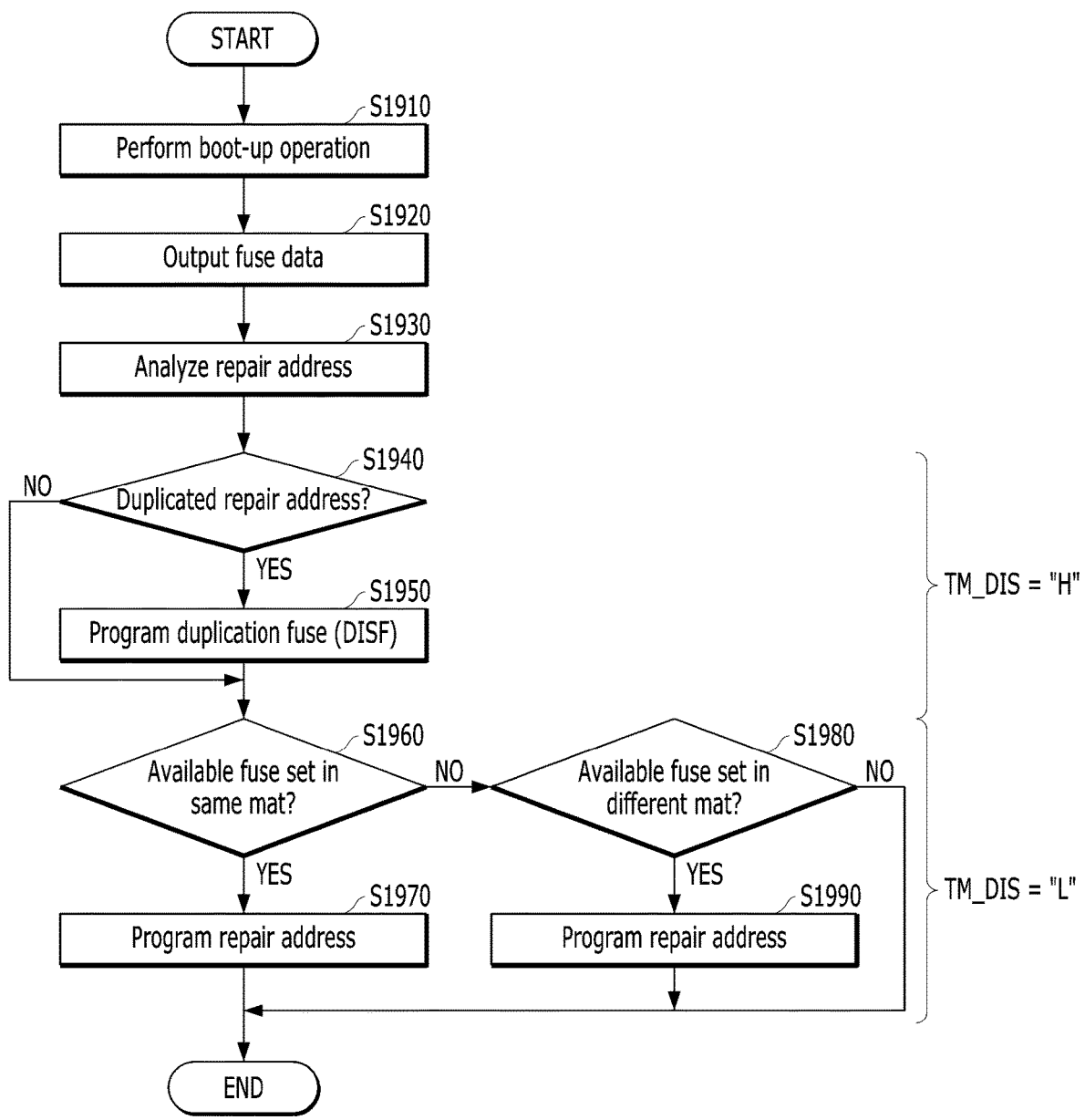
FIG. 19 is a flow chart for describing a program operation of a semiconductor memory device to which the program control circuit of FIG. 17 is applied.

FIG. 19 is a flow chart for describing a program operation of a semiconductor memory device to which the program control circuit 1150 of FIG. 17 is applied.

Referring to FIG. 19, performing a boot-up operation (at step S1910), outputting fuse data (at step S1920), analyzing repair address (at step S1930), and programming duplication fuse (at steps S1940 and S1950) are substantially the same as those of steps S1210 to S1250 of FIG. 12.

The prior availability analysis circuit 1550 determines fuse sets corresponding to redundant word lines disposed in a fail mat, according to mat information MAT<#> indicating which mat the fail mat is, and a counting address ADD<0:6> indicating a position of the fuse sets, and searches one or more available fuse set from the determined fuse sets, according to data FS_D<0> of an enable fuse EF, among fuse data FS_D<0:a>.

If any available fuse set has been searched, from the fuse sets corresponding to the redundant word lines disposed in the same fail mat ("YES" of step S1960), the prior availability analysis circuit 1550 stores the counting address ADD<0:6> as a priorly available address ADD_M<0:6>, and activates a prior availability enable signal OVERFLOWB_M. Meanwhile, since any available fuse set has been searched, the availability analysis circuit 1540 also stores the counting address ADD<0:6> as an available address ADD_U<0:6>, and activates an availability enable signal OVERFLOWB. When a program mode signal TM_DIS is a logic low level, the program enable circuit 1560 outputs, as a program enable signal PRG_EN, the availability enable signal OVERFLOWB, and the address selection circuit 1580 outputs, as a fuse address FADD<0:6>, the priorly available address ADD_M<0:6> according to the prior availability enable signal OVERFLOWB_M. The non-volatile storage circuit 1110 may program a repair address REPAIR_ADD<1:a> into a fuse set corresponding to the fuse address FADD<0:6> (at step S1970). Thus, a defective word line may be replaced with a redundant word line in the same fail mat.

If no available fuse set has been searched from the fuse sets corresponding to the redundant word lines disposed in the same fail mat ("NO" of step S1960) but the availability analysis circuit 1540 searches any available fuse set ("YES" of step S1980), the program enable circuit 1560 outputs, as the program enable signal PRG_EN, the availability enable signal OVERFLOWB and the address selection circuit 1580 outputs, as the fuse address FADD<0:6>, the available address ADD_U<0:6>. The non-volatile storage circuit 1110 may program the repair address REPAIR_ADD<1:a> into a fuse set corresponding to the fuse address FADD<0:6> (at step S1990).

If all fuse sets are in use and thus the data FS_D<0> of all enable fuses EF have a logic high level ("NO" of step S1980), the availability analysis circuit 1540 determines that there are no available fuse sets so as not to program the repair address REPAIR_ADD<1:a>. In this case, chips or packages including the non-volatile storage device may be judged by a chip kill and discarded.

According to various embodiments of the present invention, the semiconductor memory device in accordance with an embodiment of the present invention may program a repair address by first searching a replaceable redundant word line disposed in in the same file mat in which a defective word line exists. Thus, it is possible to enhance performance by improving repair efficiency.

While the present invention has been described with respect to specific embodiments, it will be apparent to those skilled in the art that various changes and modifications may be made without departing from the spirit and scope of the invention as defined in the following claims.

For example, the logical gates and transistors described in the above-described embodiments of the present invention may be realized in different positions and types according to the polarity of the inputted signals.

What is claimed is:

1. A non-volatile storage device comprising:
   a non-volatile storage circuit including a plurality of fuse sets suitable for sequentially outputting fuse data according to a counting address, each fuse set including an enable fuse, a plurality of address fuses, and a duplication fuse;
   a read control circuit suitable for receiving the fuse data, and outputting latch data by selectively masking data of the enable fuse and the address fuses using data of the duplication fuse within the received fuse data; and
   a program control circuit suitable for controlling programming the duplication fuse of a duplicated fuse set among the fuse sets when a repair address inputted from outside is identical to data of the address fuses within the duplicated fuse set, or to program the repair address into an available fuse set among the fuse sets, according to a program mode signal.

2. The non-volatile storage device of claim 1, wherein the read control circuit
   outputs the latch data having all low bits when the data of the duplication fuse is a first logic level, and
   outputs the data of the enable fuse and the address fuses, as the latch data, when the data of the duplication fuse is a second logic level.

3. The non-volatile storage device of claim 1, wherein the program control circuit includes:
   a duplication analysis circuit suitable for storing the counting address corresponding to the duplicated fuse set as a duplication address and activating a duplication enable signal when the repair address is identical to the data of the address fuses within the duplicated fuse set;
   an availability analysis circuit suitable for searching the available fuse set according to the data of the enable fuse, storing the counting address corresponding to the available fuse set as an available address, and activating an availability enable signal;
   a program enable circuit suitable for outputting, as a program enable signal, the duplication enable signal or the availability enable signal according to the program mode signal; and
   an address selection circuit suitable for outputting, as a fuse address, the duplication address or the available address according to the program mode signal.

4. The non-volatile storage device of claim 3, wherein when the non-volatile storage circuit is in a state that the program enable signal is activated, the non-volatile storage circuit, programs the duplication fuse of the fuse set corresponding to the fuse address when the program mode signal is a first logic level, and programs the repair address into the fuse set corresponding to the fuse address when the program mode signal is a second logic level.

5. The non-volatile storage device of claim 3, wherein the duplication analysis circuit includes:

a comparison circuit suitable for comparing the repair address with the data of the address fuses within the duplicated fuse set to generate a match signal; and a selection circuit suitable for storing the counting address corresponding to the duplicated fuse set as the duplication address and activating the duplication enable signal according to the match signal.

6. The non-volatile storage device of claim 3, wherein the availability analysis circuit stores the counting address corresponding to the available fuse set as the available address and activates the availability enable signal when the data of the enable fuse is a second logic level.

7. The non-volatile storage device of claim 1, wherein the non-volatile storage circuit includes an array e-fuse.

8. A non-volatile storage device comprising:

a non-volatile storage circuit including a plurality of fuse sets suitable for sequentially outputting fuse data according to a counting address, each fuse set including an enable fuse, a plurality of address fuses, and a duplication fuse;

a duplication analysis circuit suitable for storing the counting address corresponding to a duplicated fuse set as a duplication address and activating a duplication enable signal when a repair address inputted from outside is identical to data of the address fuses within the duplicated fuse set;

an availability analysis circuit suitable for searching an available fuse set according to data of the enable fuse, storing the counting address corresponding to the available fuse set as an available address, and activating an availability enable signal;

a program enable circuit suitable for outputting, as a program enable signal, the duplication enable signal or the availability enable signal according to a program mode signal; and an address selection circuit suitable for outputting, as a fuse address, the duplication address or the available address according to the program mode signal.

9. The non-volatile storage device of claim 8, wherein when the non-volatile storage circuit is in a state that the program enable signal is activated, the non-volatile storage circuit, programs the duplication fuse of the fuse set corresponding to the fuse address when the program mode signal is a first logic level, and programs the repair address into the fuse set corresponding to the fuse address when the program mode signal is a second logic level.

10. The non-volatile storage device of claim 8, wherein the duplication analysis circuit includes:

a comparison circuit suitable for comparing the repair address with the data of the address fuses within the duplicated fuse set to generate a match signal; and a selection circuit suitable for storing the counting address corresponding to the duplicated fuse set as the duplication address and activating the duplication enable signal according to the match signal.

11. The non-volatile storage device of claim 8, wherein the availability analysis circuit stores the counting address corresponding to the available fuse set as the available address and activates the availability enable signal when the data of the enable fuse is a second logic level.

12. A semiconductor memory device comprising:

a memory array area including normal memory cells and redundant memory cells which replace defective memory cells among the normal memory cells;

a non-volatile storage circuit including a plurality of fuse sets suitable for programming a repair address of the defective memory cells, and sequentially outputting fuse data according to a counting address, each fuse set including an enable fuse, a plurality of address fuses and a duplication fuse;

a read control circuit suitable for receiving the fuse data, and outputting latch data by selectively masking data of the enable fuse and the address fuses using data of the duplication fuse within the received fuse data; and a latch circuit including a plurality of latches suitable for storing the latch data in response to a plurality of storing signals which are sequentially activated.

13. The semiconductor memory device of claim 12, wherein the read control circuit outputs the latch data having all low bits when the data of the duplication fuse is a first logic level, and outputs the data of the enable fuse and the address fuses, as the latch data, when the data of the duplication fuse is a second logic level.

14. The semiconductor memory device of claim 12, further comprising a program control circuit suitable for controlling programming the duplication fuse of a duplicated fuse set among the fuse sets when the repair address is identical to data of the address fuses within the duplicated fuse set or to program the repair address into an available fuse set among the fuse sets, according to a program mode signal.

15. The semiconductor memory device of claim 14, wherein the program control circuit includes:

a duplication analysis circuit suitable for storing the counting address corresponding to the duplicated fuse set as a duplication address and activating a duplication enable signal when the repair address is identical to the data of the address fuses within the duplicated fuse set;

an availability analysis circuit suitable for searching an available fuse set according to the data of the enable fuse, storing the counting address corresponding to the available fuse set as an available address, and activating an availability enable signal;

a program enable circuit suitable for outputting, as a program enable signal, the duplication enable signal or the availability enable signal according to the program mode signal; and an address selection circuit suitable for outputting, as a fuse address, the duplication address or the available address according to the program mode signal.

16. The semiconductor memory device of claim 15, wherein when the non-volatile storage circuit is in a state that the program enable signal is activated, the non-volatile storage circuit programs the duplication fuse of the fuse set corresponding to the fuse address when the program mode signal is a first logic level, and the non-volatile storage circuit programs the repair address into the fuse set corresponding to the fuse address when the program mode signal is a second logic level.

17. The semiconductor memory device of claim 14, wherein the program control circuit includes:

a duplication analysis circuit suitable for storing the counting address corresponding to the duplicated fuse set as a duplication address and activating a duplication enable signal when the repair address is identical to the data of the address fuses within the duplicated fuse set;

an availability analysis circuit suitable for searching an available fuse set according to the data of the enable fuse, storing the counting address corresponding to the available fuse set as an available address, and activating an availability enable signal;

a prior availability analysis circuit suitable for determining fuse sets corresponding to redundant word lines disposed in a fail mat according to mat information and the counting address, searching an available fuse set from the determined fuse sets according to the data of the enable fuse, storing the counting address as a priorly available address and activating a prior availability enable signal;

a program enable circuit suitable for outputting, as a program enable signal, the duplication enable signal or the availability enable signal according to the program mode signal; and an address selection circuit suitable for selecting one of the available address and the priorly available address according to the prior availability enable signal and outputting, as a fuse address, the selected available address or the duplication address according to the program mode signal.

18. A method of operating a semiconductor memory device including a non-volatile storage circuit having a plurality of fuse sets each including an enable fuse, a plurality of address fuses, and a duplication fuse, the method comprising:

sequentially outputting fuse data from the fuse sets according to a counting address;

storing the counting address corresponding to a duplicated fuse set among the fuse sets as a duplication address and activating a duplication enable signal when a repair address is identical to data of the address fuses within the duplicated fuse set;

searching an available fuse set among the fuse sets according to data of the enable fuse, storing the counting address corresponding to the available fuse set as an available address, activating an availability enable signal; and programming the duplication fuse of the duplicated fuse set corresponding to the duplication address according to the duplication enable signal when a program mode signal is a first logic level, or programming the repair address into the available fuse set corresponding to the available address according to the availability enable signal when the program mode signal is a second logic level.

19. The method of claim 18, further comprising:

determining fuse sets corresponding to redundant word lines disposed in a fail mat according to mat information and the counting address, searching an available fuse set from the determined fuse sets according to the data of the enable fuse, storing the counting address as a priorly available address and activating a prior availability enable signal; and programming the repair address into the available fuse set corresponding to the priorly available address according to the prior availability enable signal when the program mode signal is the second logic level.

20. A method of operating a semiconductor memory device including a non-volatile storage circuit having a plurality of fuse sets each including an enable fuse, a plurality of address fuses, and a duplication fuse, the method comprising:

sequentially outputting fuse data from the fuse sets according to a counting address;

outputting latch data by selectively masking data of the enable fuse and the address fuses using data of the duplication fuse among the fuse data; and storing the latch data into a plurality of latches in response to a plurality of storing signals which are sequentially activated.

* * * * *